United States Patent
Prager et al.

(10) Patent No.: US 11,670,484 B2
(45) Date of Patent: *Jun. 6, 2023

(54) VARIABLE OUTPUT IMPEDANCE RF GENERATOR

(71) Applicant: Eagle Harbor Technologies, Inc., Seattle, WA (US)

(72) Inventors: James Prager, Seattle, WA (US); Timothy Ziemba, Bainbridge Island, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 86 days.

This patent is subject to a terminal disclaimer.

(21) Appl. No.: 17/231,931

(22) Filed: Apr. 15, 2021

(65) Prior Publication Data

US 2021/0351006 A1     Nov. 11, 2021

Related U.S. Application Data

(63) Continuation of application No. 16/697,173, filed on Nov. 26, 2019, now Pat. No. 11,004,660.

(Continued)

(51) Int. Cl.
    *H01J 37/32*      (2006.01)
    *H03K 17/56*      (2006.01)
    (Continued)

(52) U.S. Cl.
    CPC ...... *H01J 37/32128* (2013.01); *H01J 37/321* (2013.01); *H01J 37/32183* (2013.01);
    (Continued)

(58) Field of Classification Search
None
See application file for complete search history.

(56) References Cited

U.S. PATENT DOCUMENTS 2,773,935 A * 12/1956 Trousdale ............. H04Q 11/04
    327/414
2,832,832 A * 4/1958 Trousdale ............. H04Q 11/04
    370/527

(Continued)

FOREIGN PATENT DOCUMENTS

CA      2292526 A1     12/1999
EP      174164 A2     3/1986

(Continued)

OTHER PUBLICATIONS

Non-Final Office Action in U.S. Appl. No. 16/937,948, dated Aug. 24, 2021, 10 pages.

(Continued)

*Primary Examiner* — Srinivas Sathiraju

(57) ABSTRACT

Various RF plasma systems are disclosed that do not require a matching network. In some embodiments, the RF plasma system includes an energy storage capacitor; a switching circuit coupled with the energy storage capacitor, the switching circuit producing a plurality of pulses with a pulse amplitude and a pulse frequency, the pulse amplitude being greater than 100 volts; a resonant circuit coupled with the switching circuit. In some embodiments, the resonant circuit includes: a transformer having a primary side and a secondary side; and at least one of a capacitor, an inductor, and a resistor. In some embodiments, the resonant circuit having a resonant frequency substantially equal to the pulse frequency, and the resonant circuit increases the pulse amplitude to a voltage greater than 2 kV.

20 Claims, 18 Drawing Sheets

Related U.S. Application Data

(60) Provisional application No. 62/774,078, filed on Nov. 30, 2018.

(51) Int. Cl.
*H03K 3/57* (2006.01)
*H03K 3/36* (2006.01)

(52) U.S. Cl.
CPC .......... *H01J 37/32431* (2013.01); *H03K 3/36* (2013.01); *H03K 3/57* (2013.01); *H03K 17/56* (2013.01)

(56) References Cited

U.S. PATENT DOCUMENTS

| | | | |
|---|---|---|---|
| 3,339,108 A | 8/1967 | Holtje | |
| 4,070,589 A | 1/1978 | Martinkovic | |
| 4,076,996 A | 2/1978 | Maehara et al. | |
| 4,438,331 A | 3/1984 | Davis | |
| 4,504,895 A | 3/1985 | Steigerwald | |
| 4,692,851 A * | 9/1987 | Attwood | H02M 3/3376 |
| | | | 363/16 |
| 4,885,074 A | 12/1989 | Susko et al. | |
| 4,924,191 A | 5/1990 | Erb et al. | |
| 4,992,919 A | 2/1991 | Lee et al. | |
| 5,140,510 A | 8/1992 | Myers | |
| 5,313,481 A | 5/1994 | Cook et al. | |
| 5,321,597 A | 6/1994 | Alacoque | |
| 5,325,021 A | 6/1994 | Duckworth et al. | |
| 5,392,043 A | 2/1995 | Ribner | |
| 5,451,846 A | 9/1995 | Peterson et al. | |
| 5,488,552 A | 1/1996 | Sakamoto et al. | |
| 5,610,452 A | 3/1997 | Shimer et al. | |
| 5,623,171 A | 4/1997 | Nakajima | |
| 5,656,123 A | 8/1997 | Salimian et al. | |
| 5,729,562 A | 3/1998 | Birx et al. | |
| 5,796,598 A | 8/1998 | Nowak et al. | |
| 5,808,504 A | 9/1998 | Chikai et al. | |
| 5,905,646 A | 5/1999 | Crewson et al. | |
| 5,930,125 A | 7/1999 | Hitchcock et al. | |
| 5,933,335 A | 8/1999 | Hitchcock et al. | |
| 5,968,377 A * | 10/1999 | Yuasa | H01J 37/32027 |
| | | | 204/192.12 |
| 6,059,935 A * | 5/2000 | Spence | H01J 37/32 |
| | | | 422/186.05 |
| 6,066,901 A | 5/2000 | Burkhart et al. | |
| 6,087,871 A | 7/2000 | Kardo-Syssoev et al. | |
| 6,205,074 B1 | 3/2001 | Van Buskirk et al. | |
| 6,222,321 B1 | 4/2001 | Scholl et al. | |
| 6,238,387 B1 | 5/2001 | Miller, III | |
| 6,239,403 B1 | 5/2001 | Dible et al. | |
| 6,253,704 B1 | 7/2001 | Savas | |
| 6,300,720 B1 * | 10/2001 | Birx | H05H 1/54 |
| | | | 315/111.21 |
| 6,359,542 B1 | 3/2002 | Widmayer et al. | |
| 6,362,604 B1 | 3/2002 | Cravey | |
| 6,392,187 B1 | 5/2002 | Johnson | |
| 6,483,731 B1 | 11/2002 | Isurin et al. | |
| 6,496,047 B1 | 12/2002 | Iskander et al. | |
| 6,518,195 B1 | 2/2003 | Collins et al. | |
| 6,577,135 B1 | 6/2003 | Matthews et al. | |
| 6,741,120 B1 | 5/2004 | Tan | |
| 6,741,484 B2 | 5/2004 | Crewson et al. | |
| 6,831,377 B2 | 12/2004 | Yampolsky et al. | |
| 6,897,574 B2 | 5/2005 | Vaysse | |
| 6,947,300 B2 | 9/2005 | Pai et al. | |
| 7,061,230 B2 | 6/2006 | Kleine et al. | |
| 7,180,082 B1 | 2/2007 | Hassanein et al. | |
| 7,256,637 B2 | 8/2007 | Iskander et al. | |
| 7,291,545 B2 | 11/2007 | Collins et al. | |
| 7,307,375 B2 | 12/2007 | Smith et al. | |
| 7,319,579 B2 | 1/2008 | Inoue et al. | |
| 7,354,501 B2 | 4/2008 | Gondhalekar et al. | |
| 7,393,765 B2 | 7/2008 | Hanawa et al. | |
| 7,396,746 B2 | 7/2008 | Walther et al. | |
| 7,492,138 B2 | 2/2009 | Zhang et al. | |
| 7,512,433 B2 | 3/2009 | Bernhart et al. | |
| 7,521,370 B2 | 4/2009 | Hoffman | |
| 7,549,461 B2 | 6/2009 | Kroliczek et al. | |
| 7,601,619 B2 | 10/2009 | Okumura et al. | |
| 7,605,385 B2 | 10/2009 | Bauer | |
| 7,615,931 B2 * | 11/2009 | Hooke | H05H 1/46 |
| | | | 315/111.21 |
| 7,767,433 B2 | 8/2010 | Kuthi et al. | |
| 7,901,930 B2 * | 3/2011 | Kuthi | H03K 17/74 |
| | | | 435/173.6 |
| 7,936,544 B2 | 5/2011 | Beland | |
| 7,943,006 B2 | 5/2011 | Hoffman | |
| 7,948,185 B2 | 5/2011 | Smith et al. | |
| 8,093,797 B2 | 1/2012 | Tyldesley | |
| 8,093,979 B2 | 1/2012 | Wilson | |
| 8,115,343 B2 * | 2/2012 | Sanders | H03K 3/57 |
| | | | 307/108 |
| 8,120,207 B2 * | 2/2012 | Sanders | H03K 5/12 |
| | | | 307/108 |
| 8,129,653 B2 | 3/2012 | Kirchmeier et al. | |
| 8,143,790 B2 | 3/2012 | Smith et al. | |
| 8,222,936 B2 | 7/2012 | Friedman et al. | |
| 8,259,476 B2 | 9/2012 | Ben-Yaakov et al. | |
| 8,436,602 B2 | 5/2013 | Sykes | |
| 8,450,985 B2 | 5/2013 | Gray et al. | |
| 8,471,642 B2 * | 6/2013 | Hill | H03J 1/0008 |
| | | | 331/117 FE |
| 8,575,843 B2 | 11/2013 | Moore et al. | |
| 8,723,591 B2 | 5/2014 | Lee et al. | |
| 8,773,184 B1 | 7/2014 | Petrov et al. | |
| 8,847,433 B2 | 9/2014 | Vandermey | |
| 8,963,377 B2 * | 2/2015 | Ziemba | H01H 9/54 |
| | | | 327/434 |
| 9,067,788 B1 | 6/2015 | Spielman et al. | |
| 9,070,396 B1 | 6/2015 | Katchmart et al. | |
| 9,122,350 B2 | 9/2015 | Kao et al. | |
| 9,122,360 B2 | 9/2015 | Xu et al. | |
| 9,287,086 B2 | 3/2016 | Brouk et al. | |
| 9,287,092 B2 | 3/2016 | Brouk et al. | |
| 9,306,533 B1 * | 4/2016 | Mavretic | H01J 37/32183 |
| 9,329,256 B2 | 5/2016 | Dolce | |
| 9,417,739 B2 | 8/2016 | Cordeiro et al. | |
| 9,435,029 B2 | 9/2016 | Brouk et al. | |
| 9,493,765 B2 | 11/2016 | Krishnaswamy et al. | |
| 9,515,633 B1 | 12/2016 | Long et al. | |
| 9,601,283 B2 * | 3/2017 | Ziemba | H01L 29/7393 |
| 9,655,221 B2 * | 5/2017 | Ziemba | H01J 65/048 |
| 9,706,630 B2 | 7/2017 | Miller et al. | |
| 9,729,122 B2 * | 8/2017 | Mavretic | H02M 3/33569 |
| 9,767,988 B2 | 9/2017 | Brouk et al. | |
| 9,881,772 B2 * | 1/2018 | Marakhatanov | H01J 37/32091 |
| 9,960,763 B2 | 5/2018 | Miller et al. | |
| 9,966,231 B2 | 5/2018 | Boswell et al. | |
| 10,009,024 B2 | 6/2018 | Gan et al. | |
| 10,020,800 B2 | 7/2018 | Prager et al. | |
| 10,027,314 B2 | 7/2018 | Prager et al. | |
| 10,217,608 B2 * | 2/2019 | Mavretic | H02M 3/33569 |
| 10,224,822 B2 * | 3/2019 | Miller | H02M 3/33523 |
| 10,301,587 B2 | 5/2019 | Krishnaswamy et al. | |
| 10,304,661 B2 | 5/2019 | Ziemba et al. | |
| 10,373,755 B2 | 8/2019 | Prager et al. | |
| 10,373,804 B2 | 8/2019 | Koh et al. | |
| 10,382,022 B2 | 8/2019 | Prager et al. | |
| 10,448,494 B1 * | 10/2019 | Dorf | H05H 1/46 |
| 10,460,910 B2 | 10/2019 | Ziemba et al. | |
| 10,460,911 B2 | 10/2019 | Ziemba et al. | |
| 10,483,089 B2 * | 11/2019 | Ziemba | H01J 37/32146 |
| 10,483,090 B2 * | 11/2019 | Bhutta | H03H 11/28 |
| 10,510,575 B2 * | 12/2019 | Kraus | H01J 37/32715 |
| 10,555,412 B2 | 2/2020 | Dorf et al. | |
| 10,607,814 B2 | 3/2020 | Ziemba et al. | |
| 10,631,395 B2 * | 4/2020 | Sanders | H01J 37/32146 |
| 10,659,019 B2 | 5/2020 | Slobodov et al. | |
| 10,777,388 B2 | 9/2020 | Ziemba et al. | |
| 10,796,887 B2 | 10/2020 | Prager et al. | |
| 10,876,241 B2 | 12/2020 | Hu et al. | |
| 10,892,140 B2 | 1/2021 | Ziemba et al. | |

(56) References Cited

U.S. PATENT DOCUMENTS

| | | | |
|---|---|---|---|
| 10,896,809 B2* | 1/2021 | Ziemba | H03K 17/61 |
| 10,903,047 B2* | 1/2021 | Ziemba | H01J 37/32146 |
| 11,004,660 B2* | 5/2021 | Prager | H01J 37/32183 |
| 2001/0008552 A1 | 7/2001 | Harada et al. | |
| 2001/0023822 A1 | 9/2001 | Koizumi et al. | |
| 2002/0186577 A1 | 12/2002 | Kirbie | |
| 2003/0021125 A1 | 1/2003 | Rufer et al. | |
| 2003/0054647 A1 | 3/2003 | Suemasa et al. | |
| 2003/0071035 A1 | 4/2003 | Brailove | |
| 2003/0137791 A1 | 7/2003 | Arnet et al. | |
| 2003/0169107 A1 | 9/2003 | LeChevalier | |
| 2004/0085784 A1 | 5/2004 | Salama et al. | |
| 2004/0149217 A1 | 8/2004 | Collins et al. | |
| 2004/0263412 A1 | 12/2004 | Pribyl | |
| 2005/0152159 A1 | 7/2005 | Isurin et al. | |
| 2005/0219302 A1* | 10/2005 | Vogeley | H01L 41/042 347/19 |
| 2005/0270096 A1 | 12/2005 | Coleman | |
| 2006/0048894 A1 | 3/2006 | Yamazaki et al. | |
| 2006/0192774 A1 | 8/2006 | Yasumura | |
| 2006/0210020 A1 | 9/2006 | Takahashi et al. | |
| 2006/0274887 A1 | 12/2006 | Sakamoto et al. | |
| 2007/0018504 A1 | 1/2007 | Wiener et al. | |
| 2007/0114981 A1 | 5/2007 | Vasquez et al. | |
| 2007/0115705 A1 | 5/2007 | Gotzenberger et al. | |
| 2007/0212811 A1 | 9/2007 | Hanawa et al. | |
| 2007/0235412 A1 | 10/2007 | Fischer | |
| 2008/0062733 A1 | 3/2008 | Gay | |
| 2008/0106151 A1 | 5/2008 | Ryoo et al. | |
| 2008/0143260 A1 | 6/2008 | Tuymer et al. | |
| 2008/0198634 A1 | 8/2008 | Scheel et al. | |
| 2008/0231337 A1 | 9/2008 | Krishnaswamy et al. | |
| 2008/0252225 A1 | 10/2008 | Kurachi et al. | |
| 2008/0272706 A1 | 11/2008 | Kwon et al. | |
| 2009/0016549 A1 | 1/2009 | French et al. | |
| 2009/0255800 A1 | 10/2009 | Koshimizu | |
| 2009/0298287 A1 | 12/2009 | Shannon et al. | |
| 2010/0007358 A1 | 1/2010 | Schaerrer et al. | |
| 2010/0148847 A1 | 6/2010 | Schurack et al. | |
| 2010/0284208 A1 | 11/2010 | Nguyen et al. | |
| 2011/0001438 A1 | 1/2011 | Chemel et al. | |
| 2011/0140607 A1 | 6/2011 | Moore et al. | |
| 2011/0309748 A1 | 12/2011 | Xia | |
| 2012/0016282 A1 | 1/2012 | Van Brunt et al. | |
| 2012/0081350 A1 | 4/2012 | Sano et al. | |
| 2012/0155613 A1 | 6/2012 | Caiafa et al. | |
| 2013/0024784 A1 | 1/2013 | Lifton | |
| 2013/0027848 A1 | 1/2013 | Said | |
| 2013/0059448 A1 | 3/2013 | Marakhtanov et al. | |
| 2013/0075390 A1 | 3/2013 | Ashida | |
| 2013/0092529 A1 | 4/2013 | Singh et al. | |
| 2013/0113650 A1 | 5/2013 | Behbahani et al. | |
| 2013/0174105 A1 | 7/2013 | Nishio et al. | |
| 2013/0175575 A1 | 7/2013 | Ziemba et al. | |
| 2014/0009969 A1 | 1/2014 | Yuzurihara et al. | |
| 2014/0021180 A1 | 1/2014 | Vogel | |
| 2014/0077611 A1 | 3/2014 | Young et al. | |
| 2014/0109886 A1 | 4/2014 | Singleton et al. | |
| 2014/0118414 A1 | 5/2014 | Seo et al. | |
| 2014/0146571 A1 | 5/2014 | Ryoo et al. | |
| 2014/0268968 A1 | 9/2014 | Richardson | |
| 2014/0354343 A1 | 12/2014 | Ziemba et al. | |
| 2015/0028932 A1* | 1/2015 | Ziemba | H03K 17/0406 327/377 |
| 2015/0076372 A1 | 3/2015 | Ziemba et al. | |
| 2015/0084509 A1 | 3/2015 | Yuzurihara et al. | |
| 2015/0130525 A1 | 5/2015 | Miller et al. | |
| 2015/0206716 A1 | 7/2015 | Kim et al. | |
| 2015/0256086 A1 | 9/2015 | Miller et al. | |
| 2015/0303914 A1 | 10/2015 | Ziemba et al. | |
| 2015/0311680 A1 | 10/2015 | Burrows et al. | |
| 2015/0318846 A1 | 11/2015 | Prager et al. | |
| 2016/0020070 A1 | 1/2016 | Kim et al. | |
| 2016/0020072 A1 | 1/2016 | Brouk et al. | |
| 2016/0020672 A1 | 1/2016 | Shuck et al. | |
| 2016/0182001 A1 | 6/2016 | Zeng et al. | |
| 2016/0241234 A1* | 8/2016 | Mavretic | H03H 7/40 |
| 2016/0327029 A1 | 11/2016 | Ziemba et al. | |
| 2016/0327089 A1 | 11/2016 | Adam et al. | |
| 2016/0358755 A1* | 12/2016 | Long | H01J 37/32155 |
| 2017/0104469 A1* | 4/2017 | Mavretic | H04B 1/44 |
| 2017/0154726 A1 | 6/2017 | Prager et al. | |
| 2017/0243731 A1 | 8/2017 | Ziemba et al. | |
| 2017/0294842 A1* | 10/2017 | Miller | H02M 1/08 |
| 2017/0311431 A1 | 10/2017 | Park | |
| 2017/0330729 A1 | 11/2017 | Mavretic | |
| 2017/0359886 A1 | 12/2017 | Binderbauer et al. | |
| 2017/0366173 A1 | 12/2017 | Miller et al. | |
| 2018/0041183 A1* | 2/2018 | Mavretic | H02M 3/33569 |
| 2018/0226896 A1 | 8/2018 | Miller et al. | |
| 2018/0286636 A1 | 10/2018 | Ziemba et al. | |
| 2018/0315583 A1 | 11/2018 | Luere et al. | |
| 2018/0374689 A1 | 12/2018 | Abraham et al. | |
| 2019/0074806 A1* | 3/2019 | Scott | H03G 3/004 |
| 2019/0080884 A1 | 3/2019 | Ziemba et al. | |
| 2019/0131110 A1 | 5/2019 | Ziemba et al. | |
| 2019/0157044 A1* | 5/2019 | Ziemba | H01J 37/32091 |
| 2019/0157980 A1 | 5/2019 | Ji et al. | |
| 2019/0172683 A1* | 6/2019 | Mavretic | H01L 28/40 |
| 2019/0172685 A1 | 6/2019 | Van Zyl et al. | |
| 2019/0180982 A1 | 6/2019 | Brouk et al. | |
| 2019/0228952 A1 | 7/2019 | Dorf et al. | |
| 2019/0236426 A1* | 8/2019 | Zhang | G06K 19/0723 |
| 2019/0295821 A1 | 9/2019 | Shoeb et al. | |
| 2019/0326092 A1 | 10/2019 | Ogasawara et al. | |
| 2019/0348258 A1 | 11/2019 | Koh et al. | |
| 2019/0350072 A1 | 11/2019 | Dorf et al. | |
| 2019/0393791 A1 | 12/2019 | Ziemba et al. | |
| 2020/0035457 A1 | 1/2020 | Ziemba et al. | |
| 2020/0035458 A1 | 1/2020 | Ziemba et al. | |
| 2020/0037468 A1 | 1/2020 | Ziemba et al. | |
| 2020/0043702 A1* | 2/2020 | Ziemba | H01J 37/32348 |
| 2020/0051786 A1 | 2/2020 | Ziemba et al. | |
| 2020/0144030 A1 | 5/2020 | Prager et al. | |
| 2020/0168437 A1* | 5/2020 | Ziemba | H01J 37/32706 |
| 2020/0176221 A1* | 6/2020 | Prager | H01J 37/32431 |

FOREIGN PATENT DOCUMENTS

| | | | |
|---|---|---|---|
| EP | 0947048 A1 | 10/1999 | |
| EP | 1128557 A2 | 8/2001 | |
| EP | 1515430 A1 | 3/2005 | |
| FR | 2771563 A1 | 5/1999 | |
| JP | 2000268996 A | 9/2000 | |
| JP | 2009263778 A | 11/2009 | |
| TW | 200739723 A | 10/2007 | |
| TW | 201515525 A | 4/2015 | |
| WO | 9738479 A1 | 10/1997 | |
| WO | 0193419 A1 | 12/2001 | |
| WO | 2017126662 A1 | 7/2017 | |
| WO | 2018186901 A1 | 10/2018 | |

OTHER PUBLICATIONS

Restriction Requirement in U.S. Appl. No. 17/133,612, dated Aug. 26, 2021, 5 pages.

Notice of Reason for Refusal for JP Patent Application No. 2021-504454, dated Jul. 20, 2021, 8 pages.

International Preliminary Report on Patentability dated Aug. 12, 2021 in PCT Application No. PCT/US2020/016253, 07 pages.

Bland, M.J., et al., "A High Power RF Power Supply for High Energy Physics Applications," Proceedings of 2005 the Particle Accelerator Conference, IEEE pp. 4018-4020 (May 16-20, 2005).

Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).

Garwin, R., "Pulsed Power Peer Review Committee Report," Sandia National Laboratories Report, SAND2000-2515, pp. 3-38 (Oct. 2000).

(56) References Cited

OTHER PUBLICATIONS

Gaudet, J.A., et al, "Research issues in Developing Compact Pulsed Power for High Peak Power Applications on Mobile Platforms," Proceedings of the IEEE, vol. 92, No. 7, pp. 1144-1165 (Jul. 2004).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Pustylnik, M., et al., "High-voltage nanosecond pulses in a low-pressure radiofrequency discharge", Physical Review E, vol. 87, No. 6, pp. 1-9 (2013).
Quinley, M., et al., "High Voltage Nanosecond Pulser Operating at 30 kW and 400 kHz" APS-GEC-2018, 1 page (2018).
Rao, X., et al., "Combustion Dynamics of Plasma-Enhanced Pre-mixed and Nonpremixed Flames," IEEE Transactions an Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modern Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions an Dielectrics and Electrical Insulation, vol. 18, No. 4, pp. 1084-1090 (Aug. 2011) (Abstract).
Starikovskiy, A. and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, dated Sep. 15, 2014, 10 pages.
International Search Report and Written Opinion as issued in connection with International Patent Application No. PCT/US2014/065832, dated Feb. 20, 2015, 13 pages.
International Search Report and Written Opinion as issued in connection with International Patent Application No. PCT/US2015/018349, dated Jul. 14, 2015, 15 pages.
International Search Report and Written Opinion as issued in connection with International Patent Application No. PCT/US2015/040204, dated Oct. 6, 2015, 12 pages.
U.S. Non-Final Office Action in U.S. Appl. No. 14/542,487 dated Nov. 23, 2015, 11 pages.
U.S. Non-Final Office Action in U.S. Appl. No. 14/798,154 dated Jan. 5, 2016, 13 pages.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Non Final Office Action in U.S. Appl. No. 14/635,991, dated Jul. 29, 2016, 17 pages.
U.S. Final Office Action in U.S. Appl. No. 14/798,154 dated Oct. 6, 2016, 14 pages.
U.S. Final Office Action in U.S. Appl. No. 14/542,487 dated Dec. 12, 2016, 13 pages.
U.S. Final Office Action in U.S. Appl. No. 14/635,991, dated Jan. 23, 2017, 22 pages.
U.S. Notice of Allowance in U.S. Appl. No. 14/635,991, dated May 4, 2017, 07 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.
Partial Supplementary European Search Report in related foreign application No. 14861818.4, 12 Pages.
U.S. Non Final Office Action in U.S. Appl. No. 15/623,464, dated Nov. 7, 2017, 18 pages.
U.S. Final Office Action in U.S. Appl. No. 14/542,487 dated Dec. 19, 2017, 07 pages.
U.S. Final Office Action in U.S. Appl. No. 14/798,154 dated Dec. 28, 2017, 06 pages.
U.S. Notice of Allowance in U.S. Appl. No. 14/542,487 dated Mar. 21, 2018, 05 pages.
U.S. Final Office Action in U.S. Appl. No. 15/623,464, dated Mar. 27, 2018, 18 pages.
International Search Report and Written Opinion as issued in connection with International Patent Application No. PCT/US2018/016993, dated Apr. 18, 2018, 11 pages.
U.S. Notice of Allowance in U.S. Appl. No. 14/798,154 dated Jun. 1, 2018, 05 pages.
International Search Report and Written Opinion as issued in connection with International Patent Application No. PCT/US2018/025440, dated Jun. 25, 2018, 25 pages.
U.S. Notice of Allowance in U.S. Appl. No. 15/623,464, dated Oct. 17, 2018, 7 pages.
U.S. Non Final Office Action in U.S. Appl. No. 15/941,731, dated Nov. 16, 2018, 17 pages.
U.S. Non-Final Office Action in U.S. Appl. No. 15/921,650 dated Nov. 28, 2018, 11 pages.
Non-Final Office Action in U.S. Appl. No. 17/133,612 dated Feb. 1, 2022, 7 pages.
U.S. Non Final Office Action in U.S. Appl. No. 16/178,538, dated Jan. 11, 2019, 27 pages.
U.S. Non Final Office Action in U.S. Appl. No. 16/250,765, dated Mar. 29, 2019, 11 pages.
U.S. Notice of Allowance in U.S. Appl. No. 15/921,650 dated Apr. 4, 2019, 7 pages.
U.S. Non Final Office Action in U.S. Appl. No. 16/178,565, dated Apr. 4, 2019, 10 pages.
U.S. Final Office Action in U.S. Appl. No. 16/178,565, dated Jul. 12, 2019, 11 pages.
International Search Report and Written Opinion as issued in connection with International Patent Application No. PCT/US2019/043933, dated Oct. 25, 2019, 9 pages.

(56) References Cited

OTHER PUBLICATIONS

U.S. Notice of Allowance in U.S. Appl. No. 16/178,565, dated Nov. 14, 2019, 5 pages.
International Search Report and Written Opinion as issued in connection with International Patent Application No. PCT/US2019/043932, dated Dec. 5, 2019, 16 pages.
International Search Report and Written Opinion as issued in connection with International Patent Application No. PCT/US2019/043988, dated Dec. 10, 2019, 13 pages.
U.S. Non Final Office Action in U.S. Appl. No. 16/250,157 dated Dec. 19, 2019, 6 pages.
International Search Report and Written Opinion as issued in connection with International Patent Application No. PCT/US2019/046067, dated Jan. 3, 2020, 13 pages.
U.S. Notice of Allowance in U.S. Appl. No. 16/525,357, dated Jan. 14, 2020, 8 pages.
U.S. Non-Final Office Action in U.S. Appl. No. 16/523,840, dated Mar. 19, 2020, 6 pages.
U.S. Restriction Requirement in U.S. Appl. No. 16/537,513, dated Apr. 1, 2020, 7 pages.
International Search Report and Written Opinion as issued in connection with International Patent Application No. PCT/US2019/013988, dated Apr. 9, 2020, 4 pages.
U.S. Notice of Allowance in U.S. Appl. No. 16/250,157 dated Apr. 13, 2020, 8 pages.
U.S. Non-Final Office Action in U.S. Appl. No. 16/524,950, dated Apr. 16, 2020, 8 pages.
International Search Report and Written Opinion as issued in connection with International Patent Application No. PCT/US2020/016253, dated Apr. 29, 2020, 7 pages.
U.S. Restriction Requirement in U.S. Appl. No. 16/524,967, dated Apr. 29, 2020, 6 pages.
U.S. Non-Final Office Action in U.S. Appl. No. 16/722,115, dated May 14, 2020, 6 pages.
International Search Report and Written Opinion as issued in connection with International Patent Application No. PCT/US2020/012641, dated May 28, 2020, 15 pages.
U.S. Non Final Office Action in U.S. Appl. No. 16/697,173, dated Jun. 26, 2020, 19 pages.
U.S. Final Office Action in U.S. Appl. No. 16/523,840, dated Jun. 26, 2020, 5 pages.
U.S. Non Final Office Action in U.S. Appl. No. 16/779,270, dated Jul. 16, 2020, 9 pages.
U.S. Notice of Allowance in U.S. Appl. No. 16/524,967, dated Jul. 17, 2020, 11 pages.
U.S. Notice of Allowance in U.S. Appl. No. 16/779,270, dated Aug. 10, 2020, 6 pages.
U.S. Non Final Office Action in U.S. Appl. No. 16/537,513, dated Sep. 3, 2020, 13 pages.
International Search Report and Written Opinion as issued in connection with International Patent Application No. PCT/US2020/040579, dated Sep. 30, 2020, 10 pages.
U.S. Notice of Allowance in U.S. Appl. No. 16/523,840, dated Sep. 30, 2020, 11 pages.
U.S. Notice of Allowance in U.S. Appl. No. 16/779,270, dated Oct. 8, 2020, 5 pages.
International Search Report and Written Opinion as issued in connection with International Patent Application No. PCT/US2020/034427, dated Oct. 16, 2020, 9 pages.
U.S. Notice of Allowance in U.S. Appl. No. 16/524,950, dated Oct. 19, 2020, 9 pages.
U.S. Notice of Allowance in U.S. Appl. No. 16/524,950, dated Nov. 16, 2020, 9 pages.
U.S. Notice of Allowance in U.S. Appl. No. 16/523,840, dated Dec. 4, 2020, 11 pages.
U.S. Final Office Action in U.S. Appl. No. 16/722,115, dated Dec. 2, 2020, 7 pages.
U.S. Final Office Action in U.S. Appl. No. 16/537,513, dated Jan. 7, 2021, 12 pages.
U.S. Notice of Allowance in U.S. Appl. No. 16/524,926, dated Jan. 15, 2021, 9 pages.
International Search Report and written opinion received for PCT Patent Application No. PCT/US2020/60799, dated Feb. 5, 2021, 11 pages.
U.S. Notice of Allowance in U.S. Appl. No. 16/697,173, dated Feb. 9, 2021, 13 pages.
U.S. Notice of Allowance in U.S. Appl. No. 16/848,830, dated Feb. 19, 2021, 8 pages.
U.S. Notice of Allowance in U.S. Appl. No. 16/722,115, dated Apr. 1, 2021, 9 pages.
U.S. Advisory Action in U.S. Appl. No. 16/537,513, dated Apr. 22, 2021, 5 pages.
U.S. Notice of Allowance in U.S. Appl. No. 16/721,396, dated Apr. 23, 2021, 10 pages.
U.S. Non-Final Office Action in U.S. Appl. No. 16/722,115, dated May 3, 2021, 9 pages.
International Search Report and Written Opinion as issued in connection with International Patent Application No. PCT/US2020/066990, dated May 5, 2021, 9 pages.
U.S. Notice of Allowance in U.S. Appl. No. 16/848,830, dated May 13, 2021, 6 pages.

* cited by examiner

VARIABLE OUTPUT IMPEDANCE RF GENERATOR

CROSS-REFERENCE TO RELATED APPLICATIONS

This application claims priority to U.S. Provisional Patent Application No. 62/774,078 filed Dec. 7, 2018, titled "VARIABLE OUTPUT IMPEDANCE RF GENERATOR," which is incorporated by reference in its entirety.

BACKGROUND

The application of RF-excited gaseous discharges in thin film fabrication technology has become standard. The simplest geometry most commonly used is that of two planar electrodes between which a voltage is applied. A schematic representation of such a planar RF plasma reactor is shown in FIG. 1. The plasma is separated from each electrode by a plasma sheath.

Positive ions produced in the plasma volume are accelerated across the plasma sheaths and arrive at the electrodes with an Ion Energy Distribution Function (IEDF) which is determined by the magnitude and the waveform of the time dependent potential difference across the sheaths, the gas pressure, the physical geometry of the reactor, and/or other factors. This ion bombardment energy distribution may determine the degree of anisotropy in thin-film etching amount of ion impact induced damage to surfaces, etc.

SUMMARY

Some embodiments include an RF system that includes an energy storage capacitor, a switching circuit, a resonant circuit, and an energy recovery circuit. In some embodiments, the switching circuit may be coupled with the energy storage capacitor. In some embodiments, the switching circuit producing a plurality of pulses with a pulse amplitude and a pulse frequency where the pulse amplitude may be greater than 100 volts. In some embodiments, the resonant circuit may be coupled with the switching circuit and may include a transformer having a primary side and a secondary side; and at least one of a capacitor, an inductor, and a resistor. In some embodiments, the resonant circuit has a resonant frequency substantially equal to the pulse frequency, and the resonant circuit increases the pulse amplitude to a voltage greater than 2 kV. In some embodiments, the energy recovery circuit may be coupled with the energy storage capacitor and the secondary side of the transformer and the energy recovery circuit comprising a diode and an inductor.

In some embodiments, the RF system includes a plasma chamber coupled with the resonant circuit. In some embodiments, the switching circuit comprises either a full-bridge driver or a half-bridge driver.

In some embodiments, the resonant circuit comprises an inductor, and the resonant frequency comprises $$f_{resonant} \approx \frac{1}{2\pi\sqrt{(L)(C)}},$$

where the inductance L includes any stray inductance of the transformer and the inductance of the inductor, and the capacitance C includes any stray capacitance of the transformer.

In some embodiments, the resonant circuit comprises a capacitor, and the resonant frequency comprises $$f_{resonant} \approx \frac{1}{2\pi\sqrt{(L)(C)}},$$

where the inductance L includes any stray inductance of the transformer, and the capacitance C includes any stray capacitance of the transformer and the capacitance of the capacitor.

Some embodiments include an RF system that includes an energy storage capacitor, a switching circuit, a resonant circuit, and a plasma chamber. In some embodiments, the switching circuit may be coupled with the energy storage capacitor. In some embodiments, the switching circuit producing a plurality of pulses with a pulse amplitude and a pulse frequency where the pulse amplitude may be greater than 100 volts. In some embodiments, the resonant circuit may be coupled with the switching circuit and may include a transformer having a primary side and a secondary side; and at least one of a capacitor, an inductor, and a resistor. In some embodiments, the resonant circuit has a resonant frequency substantially equal to the pulse frequency, and the resonant circuit increases the pulse amplitude to a voltage greater than 2 kV. In some embodiments, the plasma chamber coupled with the resonant circuit.

In some embodiments, the RF plasma system may include a transformer coupled with the resonant circuit. In some embodiments, the RF plasma system may include a resistive output stage. In some embodiments, the RF plasma system may include an energy recovery stage. In some embodiments, the RF plasma system may include a bias compensation circuit.

In some embodiments, either or both the inductance (L) and/or the capacitance (C) of the transformer determine the resonant frequency according to:

$$f_{resonant} \approx \frac{1}{2\pi\sqrt{(L)(C)}}.$$

In some embodiments, the resonant frequency comprises $$f_{resonant} \approx \frac{1}{2\pi\sqrt{(L)(C)}},$$

where the inductance L includes any stray inductance of the transformer and the capacitance C includes any stray capacitance of the transformer.

In some embodiments, the high voltage switching power supply comprises either a full-bridge driver or a half-bridge driver.

In some embodiments, the switching power supply is driven with a frequency selected from the group consisting of 400 kHz, 0.5 MHz, 2.0 MHz, 4.0 MHz, 13.56 MHz, 27.12 MHz, 40.68 MHz, and 50 MHz.

Some embodiments include an RF system that includes a high voltage switching power supply, an inductively coupled plasma source, and a capacitor. In some embodiments, the high voltage switching power supply producing a plurality of pulses with a pulse amplitude and a pulse frequency, the pulse amplitude being greater than 100 volts. In some embodiments, the inductively coupled plasma source comprising a coil that is electrically coupled with the high voltage switching power supply. In some embodiments, the capacitor and the inductance of the inductively coupled plasma source resonate with a resonant frequency substantially equal to the pulse frequency.

In some embodiments, the resonant frequency comprises $$f_{resonant} \approx \frac{1}{2\pi\sqrt{(L)(C)}},$$

where the inductance L includes the inductance of the inductively coupled plasma source and the capacitance C includes the capacitance of the capacitor. In some embodiments, the high voltage switching power supply comprises either a full-bridge driver or a half-bridge driver.

Some embodiments include an RF system that includes a high voltage switching power supply, a capacitively coupled plasma, and an inductor. In some embodiments, the high voltage switching power supply producing a plurality of pulses with a pulse amplitude and a pulse frequency, the pulse amplitude being greater than 100 volts. In some embodiments, the inductor and the capacitance of the capacitively coupled plasma form a resonant circuit with a resonant frequency substantially equal to the pulse frequency.

In some embodiments, the resonant frequency comprises $$f_{resonant} \approx \frac{1}{2\pi\sqrt{(L)(C)}},$$

where the inductance L includes the inductance of the inductor and the capacitance C includes the capacitance of the capacitively coupled plasma. In some embodiments, the high voltage switching power supply comprises either a full-bridge driver or a half-bridge driver.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DESCRIPTION OF THE DISCLOSURE

Figure 1:
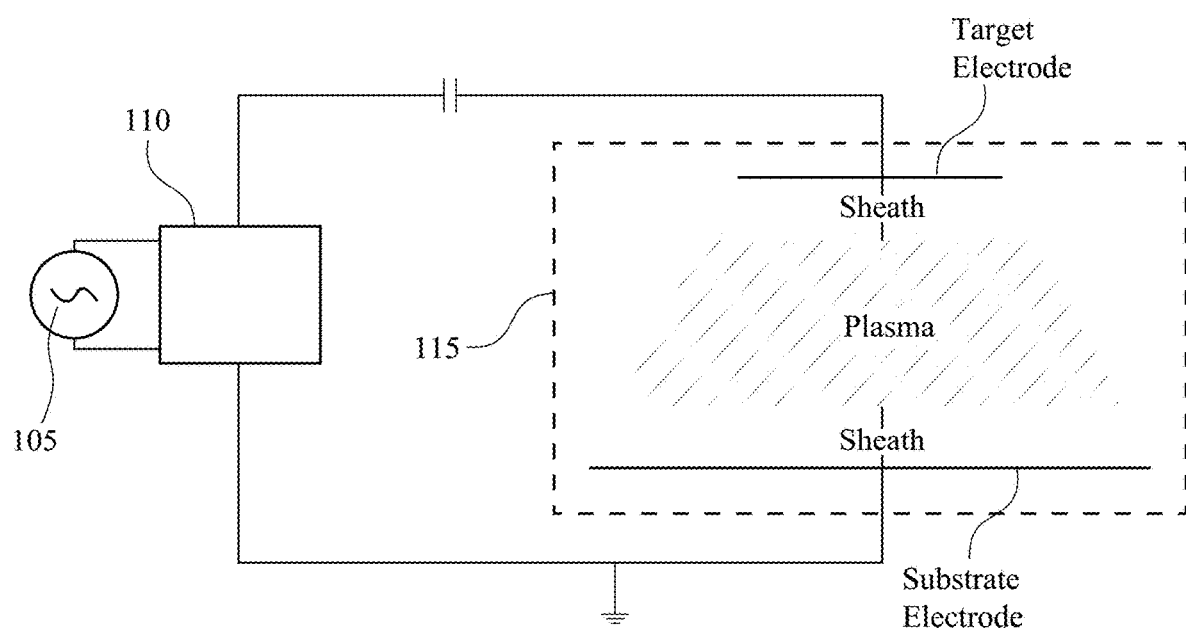
FIG. 1 is a schematic representation of a planar RF plasma reactor according to some embodiments.

In some embodiments, systems and methods are disclosed to provide switching power to a plasma chamber without the use of a matching network. As shown in FIG. 1, a typical RF driver 105 requires a matching network 110, for example, to ensure the impedance of the RF driver 105 matches the impedance of the plasma chamber 115. To accomplish this, a matching network 110 can include any combinations of transformers, resistors, inductors, capacitors, and/or transmission lines. Often the matching network 110 may need to be tuned to ensure that the impedance of the RF driver 105 and the impedance of the plasma chamber 115 match. This tuning may be required during plasma processing. Matching networks, however, can be relatively slow at tuning (e.g., requiring at best less than around tens or hundreds of milliseconds to tune), which may not allow real time tuning.

Embodiments described in this disclosure include circuits and processes for driving switching power to a plasma chamber without a matching network. In some embodiments, a full (or half) bridge circuit may be used to drive a resonant circuit at its resonant frequency. Because the resonant circuit is being driven at its resonant frequency, the output voltage of the resonant circuit may be higher than the input voltage. In some embodiments, this resonant condition may allow for a drive voltage of a few hundred volts to generate about 4 kV or more of output voltage at a transformer.

As used throughout this disclosure, the term "high voltage" may include a voltage greater than 500 V, 1 kV, 10 kV, 20 kV, 50 kV, 100 kV, etc.; the term "high frequency" may be a frequency greater than 100 Hz, 250 Hz, 500 Hz, 750 Hz, 1 kHz, 10 kHz, 100 kHz, 200 kHz, 500 kHz, 1 MHz, 10 MHz, 50 MHz, 100 MHz, etc., the term "fast rise time" may include a rise time less than about 1 ns, 10 ns, 50 ns, 100 ns, 250 ns, 500 ns, 1,000 ns, etc.; the term "fast fall time" may include a fall time less than about 1 ns, 10 ns, 50 ns, 100 ns, 250 ns, 500 ns, 1,000 ns, etc.); and the term short pulse width may include pulse widths less than about 1 ns, 10 ns, 50 ns, 100 ns, 250 ns, 500 ns, 1,000 ns, etc.).

Figure 2:
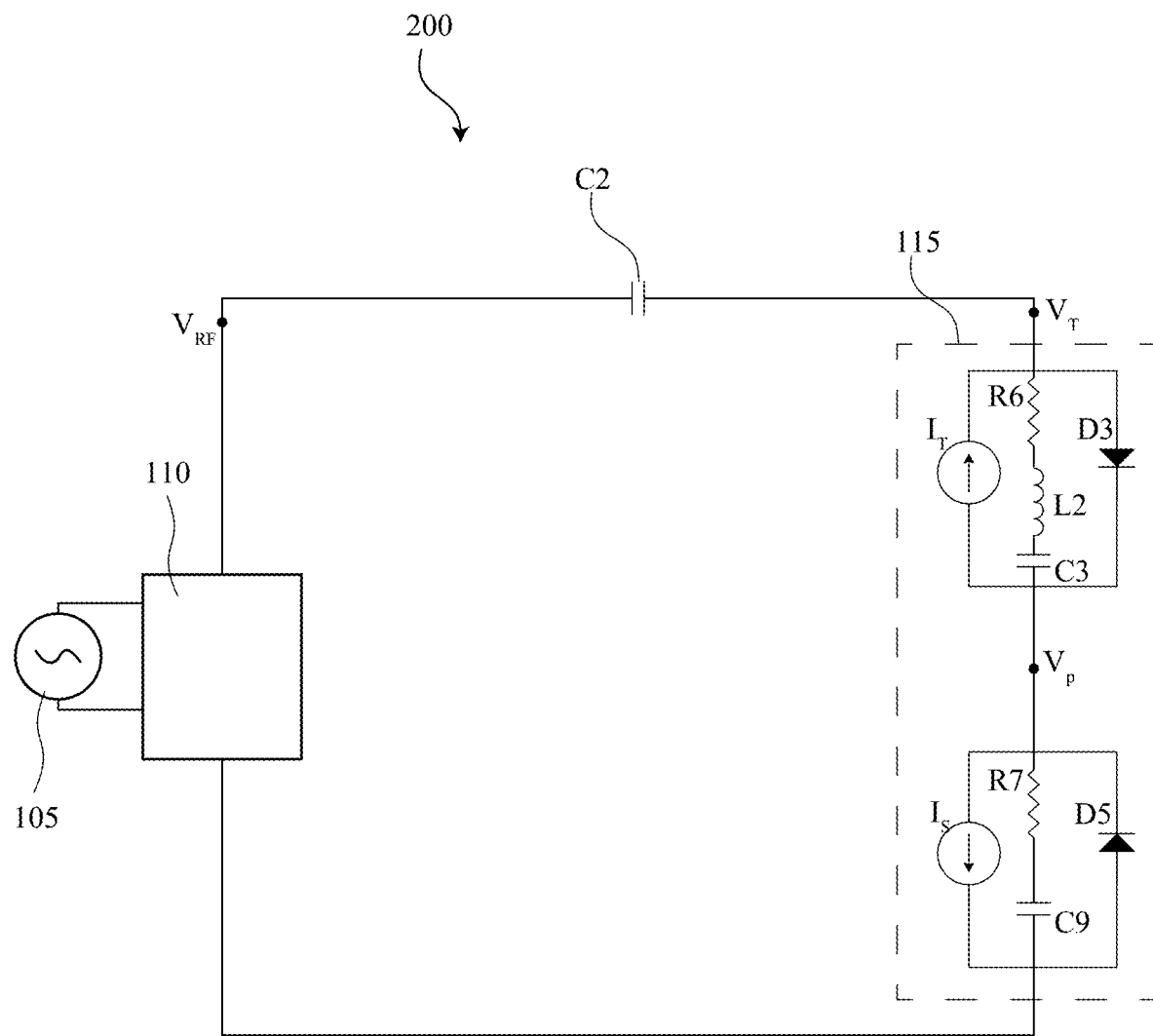
FIG. 2 is schematic of the equivalent electric circuit model of an RF plasma reactor according to some embodiments.

FIG. 2 is schematic of an equivalent electric circuit model 200 for an RF driver 105, which may be an RF power supply, and an equivalent circuit of a plasma chamber 115. In this example, $V_{RF}$ is the voltage of the applied RF signal from a RF driver 105 with a matching network 110. $V_T$ and $V_P$ are the potentials of the target electrode and the plasma, respectively. In addition, $V_{SS}=V_P$ and $V_{ST}=V_T-V_P$ are the voltages across the substrate or chamber wall plasma sheath ($V_{SS}$) and the target plasma sheath ($V_{ST}$), respectively. The blocking capacitor is represented by C2; C3 and $I_T$ represent the capacitance and the conduction current through the sheath adjacent to the target electrode, respectively, while C9 and $I_S$ represent the corresponding values of the capacitance and current for the sheath adjacent to the substrate electrode.

In some embodiments, the electrical resistance of the plasma may be small with respect to the sheath resistance for the plasma electron densities and voltage frequencies described in this disclosure. However, inclusion of the plasma resistance does not introduce any complications for the circuit model.

Figure 3:
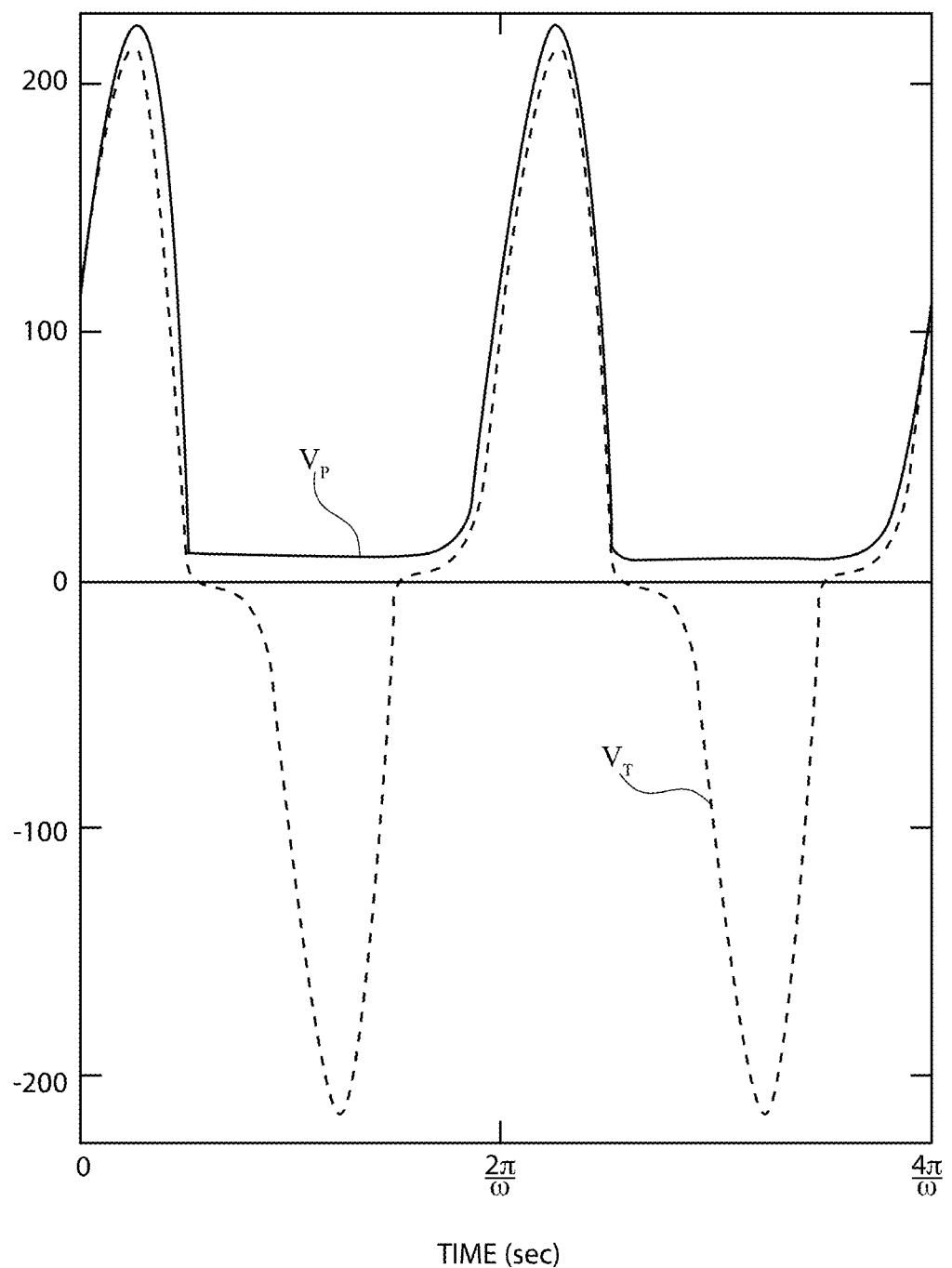
FIG. 3. illustrates calculated waveforms of the voltage $V_r$ across the plasma reactor and the plasma potential $V_P$ for equal areas of the target and substrate electrodes.
Figure 4:
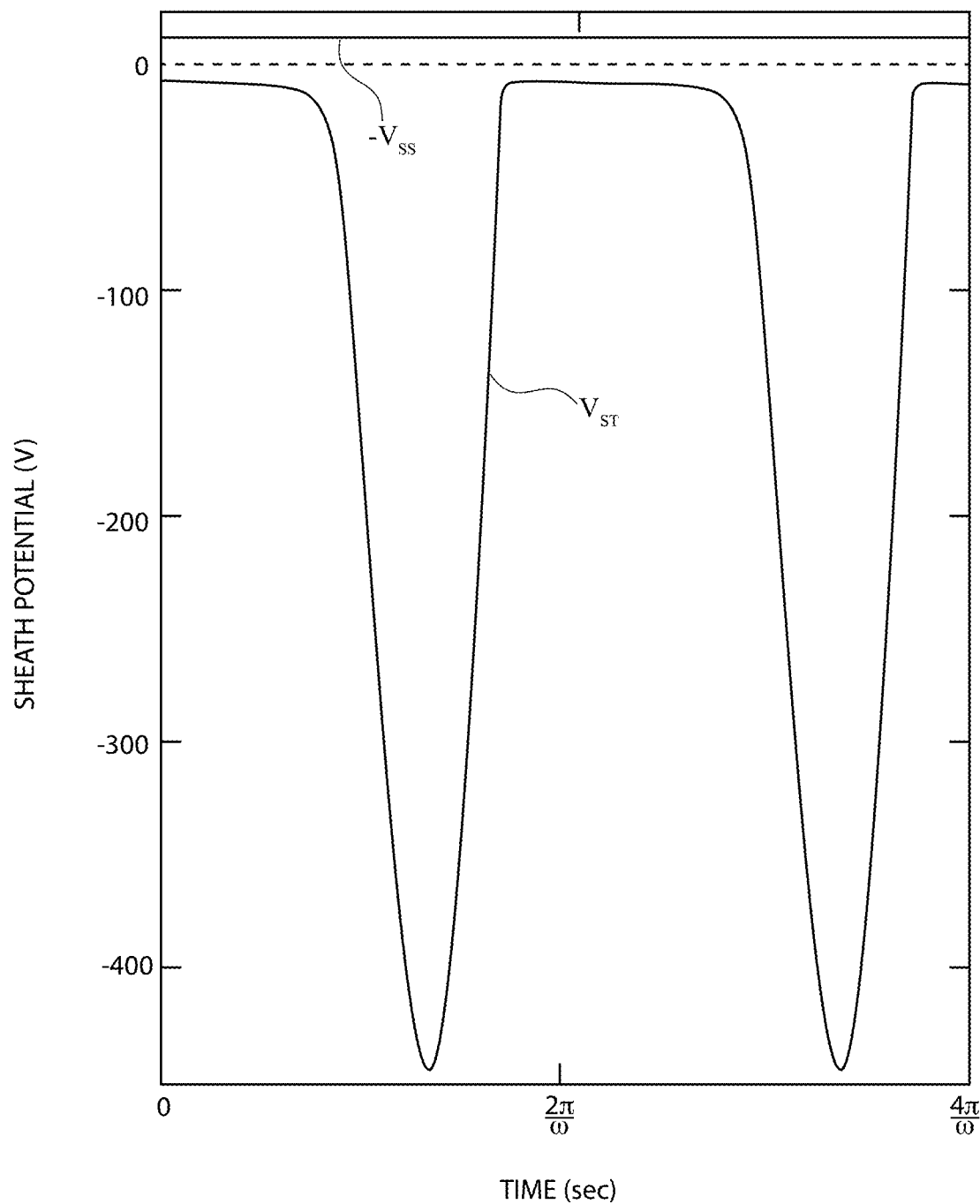
FIG. 4 Illustrates calculated waveforms of the potential $V_{ST}$ across the plasma sheath adjacent to the target electrode and that of the potential $V_{ss}$ across the substrate electrode.

FIG. 3. Illustrates waveforms of the voltage $V_T$ across a plasma reactor such as, for example, those shown in FIG. 1 and FIG. 2, and the plasma potential $V_P$ for equal areas of the target and substrate electrodes. FIG. 4 Illustrates calculated waveforms of the potential $V_{ST}$ across the plasma sheath adjacent to the target electrode shown in FIG. 1 and that of the potential $V_{ss}$ across the substrate electrode sheath for $A_T/A_S=0.2$, where $A_T$ and $A_S$ are the areas of the target electrode and the substrate electrode respectively. FIG. 4 shows the half sine wave of the sheath potential going from 0 to −450V.

Figure 5:
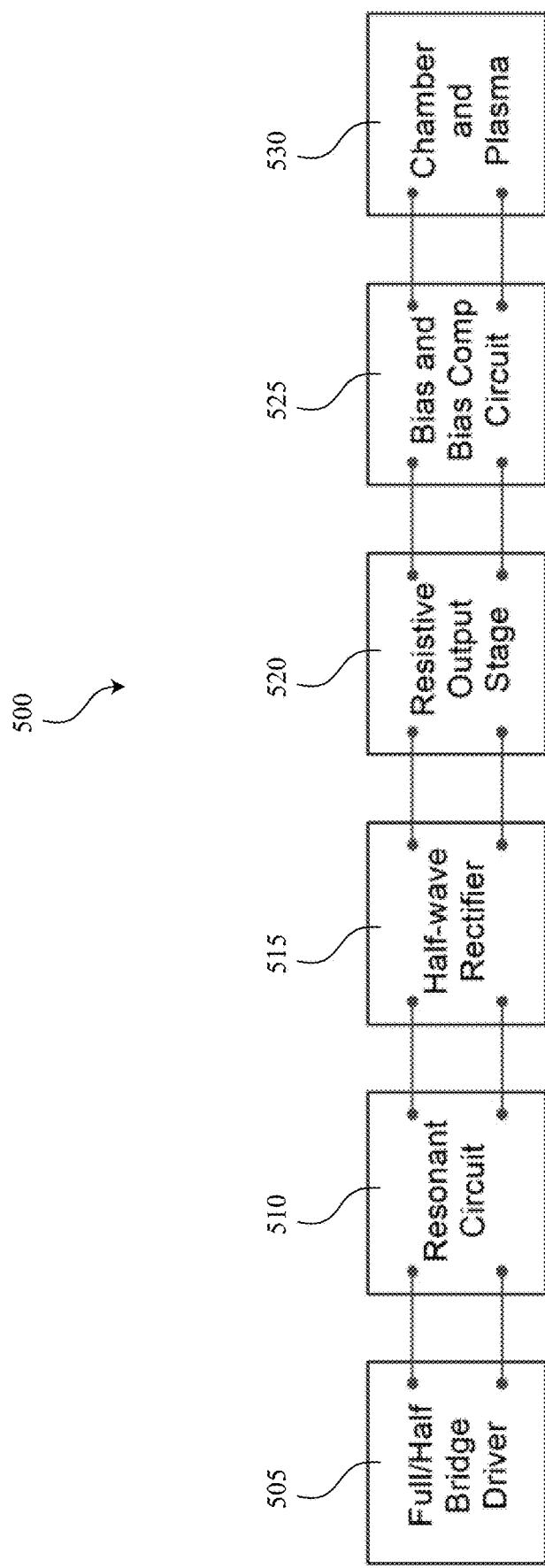
FIG. 5 is a block diagram of an RF Driver according to some embodiments.

FIG. 5 is a block diagram of a driver and chamber circuit 500 without a matching network according to some embodiments. The driver and chamber circuit 500 may include an RF driver 505 that may include a voltage source and either a full-bridge driver or a half bridge driver or an equivalent driver. The driver and chamber circuit 500 may include a resonant circuit 510 having a transformer and resonant elements. The driver and chamber circuit 500 may include may also include a half-wave rectifier 515 electrically coupled with the resonant circuit 510. A resistive output stage 520 (or an energy recovery circuit) may be coupled with the half-wave rectifier. A bias compensation circuit 525 may be coupled with the resistive output stage 520. The plasma and chamber 530 and a plasma may be coupled with the bias compensation circuit 525.

Figure 6:
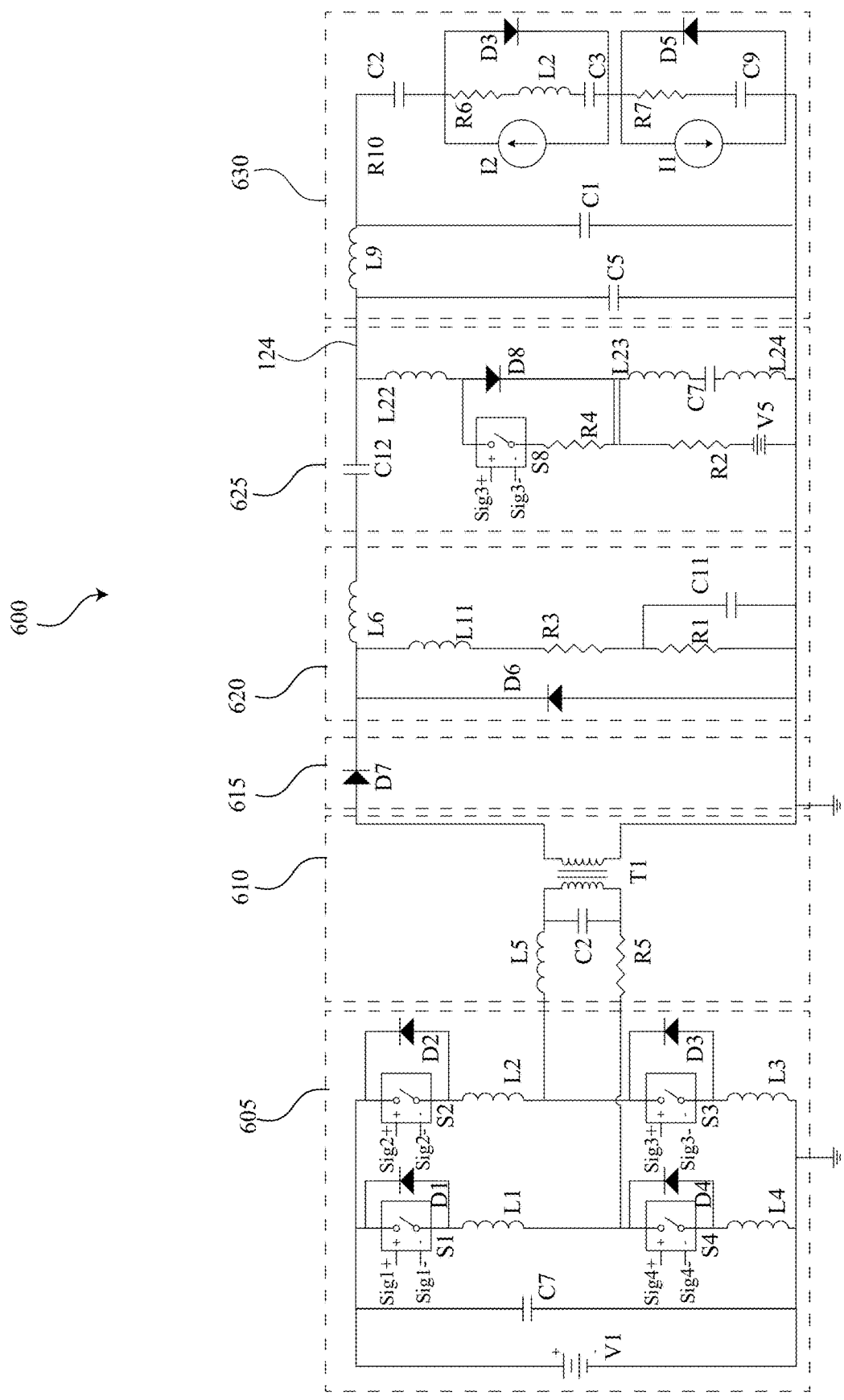
FIG. 6 is a circuit diagram of an RF Driver according to some embodiments.

FIG. 6 is a circuit diagram of a driver and chamber circuit 600 according to some embodiments.

In this example, the driver and chamber circuit 600 may include an RF driver 605. The RF driver 605, for example, may be a half-bridge driver or a full-bridge driver as shown in FIG. 6. The RF driver 605 may include an input voltage source V1 that may be a DC voltage source (e.g., a capacitive source, AC-DC converter, etc.). In some embodiments, the RF driver 605 may include four switches S1, S2, S3, and S4. In some embodiments, the RF driver 605 may include a plurality of switches S1, S2, S3, and S4 in series or in parallel. These switches S1, S2, S3, and S4, for example, may include any type of solid-state switch such as, for example, IGBTs, a MOSFETs, a SiC MOSFETs, SiC junction transistors, FETs, SiC switches, GaN switches, photoconductive switches, etc. These switches S1, S2, S3, and S4 may be switched at high frequencies and/or may produce a high voltage pulses. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

Each switch of switches S1, S2, S3, and S4 may be coupled in parallel with a respective diode D1, D2, D3, and D4 and may include stray inductance represented by inductor L1, L2, L3, and L4. In some embodiments, the inductances of inductor L1, L2, L3, and L4 may be equal. In some embodiments, the inductances of inductor L1, L2, L3, and L4 may be less than about 50 nH, 100 nH, 150 nH, 500 nH, 1,000 nH, etc. The combination of a switch (S1, S2, S3, or S4) and a respective diode (D1, D2, D3, or D4) may be coupled in series with a respective inductor (L1, L2, L3, or L4). Inductors L3 and L4 are connected with ground. Inductor L1 is connected with switch S4 and the resonant circuit 610. And inductor L2 is connected with switch S3 and the opposite side of the resonant circuit 610.

In some embodiments, the RF driver 605 may be coupled with a resonant circuit 610. The resonant circuit 610 may include a resonant inductor L5 and/or a resonant capacitor C2 coupled with a transformer T1. The resonant circuit 610 may include a resonant resistance R5, for example, that may include the stray resistance of any leads between the RF driver 605 and the resonant circuit 610 and/or any component within the resonant circuit 610 such as, for example, the transformer T1, the capacitor C2, and/or the inductor L5. In some embodiments, the resonant resistance R5 comprises only stray resistances of wires, traces, or circuit elements. While the inductance and/or capacitance of other circuit elements may affect the driving frequency, the driving frequency can be set largely by choice of the resonant inductor L5 and/or the resonant capacitor C2. Further refinements and/or tuning may be required to create the proper driving frequency in light of stray inductance or stray capacitance. In addition, the rise time across the transformer T1 can be adjusted by changing L5 and/or C2, provided that:

$$f_{resonant} = \frac{1}{2\pi\sqrt{(L5)(C2)}} = \text{constant}.$$

Figure 17:
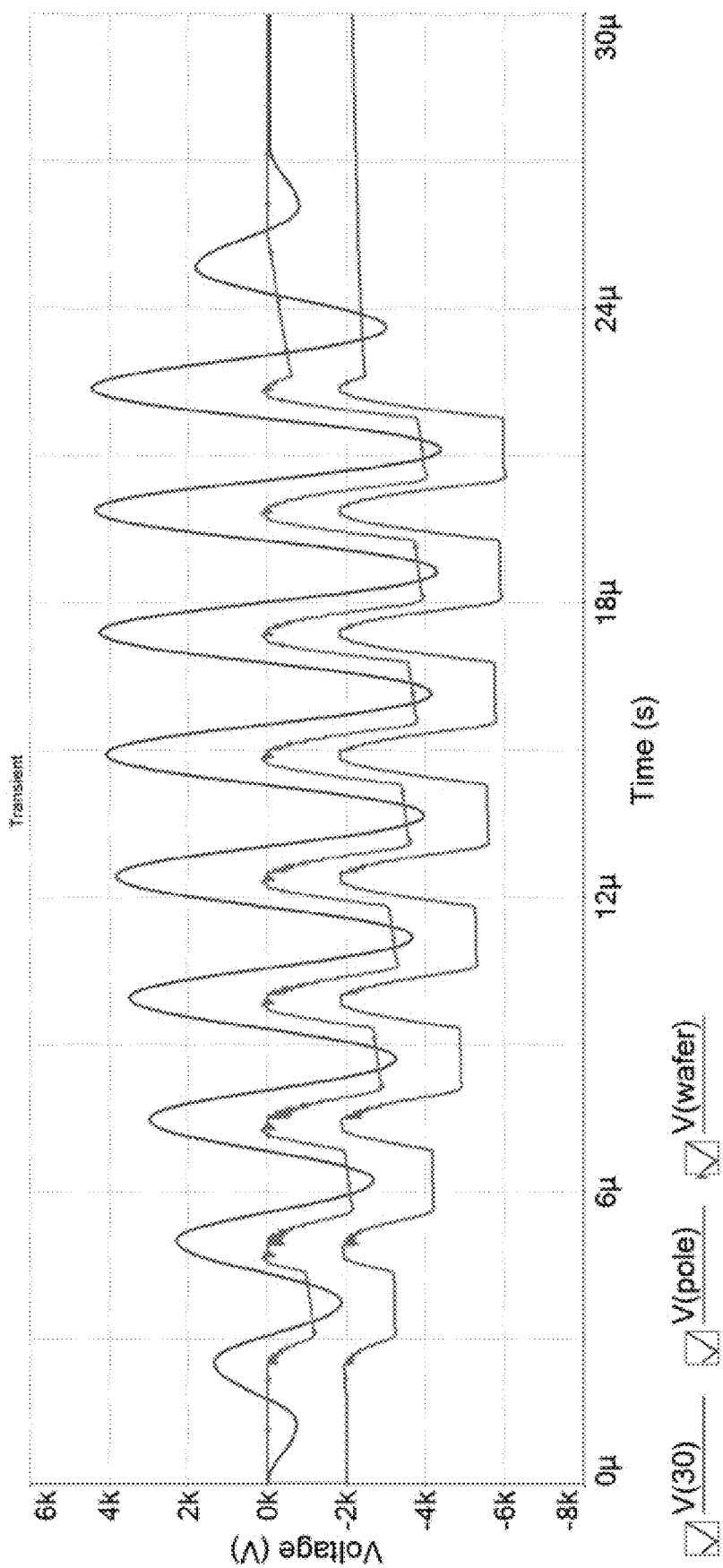
FIG. 17 is a short burst waveform of the voltage across the transformer T1 (red), at the Pole (green), and at the wafer (blue).

In some embodiments, large inductance values for L5 can result in slower or shorter rise times. These values may also affect the burst envelope. As shown in FIG. 17, each burst can include transient and steady state pulses. The transient pulses within each burst may be set by L5 and/or the Q of the system until full voltage is reached during the steady state pulses.

If the switches in the RF driver 605 are switched at the resonant frequency, $f_{resonant}$, then the output voltage at the transformer T1 will be amplified. In some embodiments, the resonant frequency may be about 400 kHz, 0.5 MHz, 2.0 MHz, 4.0 MHz, 13.56 MHz, 27.12 MHz, 40.68 MHz, 50 MHz, etc.

In some embodiments, the resonant capacitor C2 may include the stray capacitance of the transformer T1 and/or a physical capacitor. In some embodiments, the resonant capacitor C2 may have a capacitance of about 10 µF, 1 µF, 100 nF, 10 nF, etc. In some embodiments, the resonant inductor L5 may include the stray inductance of the transformer T1 and/or a physical inductor. In some embodiments, the resonant inductor L5 may have an inductance of about 50 nH, 100 nH, 150 nH, 500 nH, 1,000 nH, etc. In some embodiments, the resonant resistor R5 may have a resistance of about 10 ohms, 25 ohms, 50 ohms, 100 ohms, 150 ohms, 500 ohms, etc.

In some embodiments, the resonant resistor R5 may represent the stray resistance of wires, traces, and/or the transformer windings within the physical circuit. In some embodiments, the resonant resistor R5 may have a resistance of about 10 mohms, 50 mohms, 100 mohms, 200 mohms, 500 mohms, etc.

In some embodiments, the transformer T1 may comprise a transformer as disclosed in U.S. patent application Ser. No. 15/365,094, titled "High Voltage Transformer," which is incorporated into this document for all purposes. In some embodiments, the output voltage of the resonant circuit 610 can be changed by changing the duty cycle (e.g., the switch "on" time or the time a switch is conducting) of switches S1, S2, S3, and/or S4. For example, the longer the duty cycle, the higher the output voltage; and the shorter the duty cycle, the lower the output voltage. In some embodiments, the output voltage of the resonant circuit 610 can be changed or tuned by adjusting the duty cycle of the switching in the RF driver 605.

For example, the duty cycle of the switches can be adjusted by changing the duty cycle of signal Sig1, which opens and closes switch S1; changing the duty cycle of signal Sig2, which opens and closes switch S2; changing the duty cycle of signal Sig3, which opens and closes switch S3; and changing the duty cycle of signal Sig4, which opens and closes switch S4. By adjusting the duty cycle of the switches S1, S2, S3, or S4, for example, the output voltage of the resonant circuit 610 can be controlled.

In some embodiments, each switch S1, S2, S3, or S4 in the resonant circuit 605 can be switched independently or in conjunction with one or more of the other switches. For example, the signal Sig1 may be the same signal as signal Sig3. As another example, the signal Sig2 may be the same signal as signal Sig4. As another example, each signal may be independent and may control each switch S1, S2, S3, or S4 independently or separately.

In some embodiments, the resonant circuit 610 may be coupled with a half-wave rectifier 615 that may include a blocking diode D7.

In some embodiments, the half-wave rectifier 615 may be coupled with the resistive output stage 620. The resistive output stage 620 may include any resistive output stage known in the art. For example, the resistive output stage 620 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes.

For example, the resistive output stage 620 may include an inductor L11, resistor R3, resistor R1, and capacitor C11. In some embodiments, inductor L11 may include an inductance of about 5 µH to about 25 µH. In some embodiments, the resistor R1 may include a resistance of about 50 ohms to about 250 ohms. In some embodiments, the resistor R3 may comprise the stray resistance in the resistive output stage 620.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, the resistor R1 may discharge the load (e.g., a plasma sheath capacitance). In some embodiments, the resistive output stage 620 may be configured to discharge over about 1 kilowatt of average power during each pulse cycle and/or a joule or less of energy in each pulse cycle. In some embodiments, the resistance of the resistor R1 in the resistive output stage 620 may be less than 200 ohms. In some embodiments, the resistor R1 may comprise a plurality of resistors arranged in series or parallel having a combined capacitance less than about 200 pF (e.g., C11).

In some embodiments, the resistive output stage 620 may include a collection of circuit elements that can be used to control the shape of a voltage waveform on a load. In some embodiments, the resistive output stage 620 may include passive elements only (e.g., resistors, capacitors, inductors, etc.). In some embodiments, the resistive output stage 620 may include active circuit elements (e.g., switches) as well as passive circuit elements. In some embodiments, the resistive output stage 620, for example, can be used to control the voltage rise time of a waveform and/or the voltage fall time of waveform.

In some embodiments, the resistive output stage 620 can discharge capacitive loads (e.g., a wafer and/or a plasma). For example, these capacitive loads may have small capacitance (e.g., about 10 pF, 100 pF, 500 pF, 1 nF, 10 nF, 100 nF, etc.).

In some embodiments, a resistive output stage can be used in circuits with pulses having a high pulse voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.) and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 620 may include a series or parallel network of passive components. For example, the resistive output stage 620 may include a series of a resistor, a capacitor, and an inductor. As another example, the resistive output stage 620 may include a capacitor in parallel with an inductor and the capacitor-inductor combination in series with a resistor. For example, L11 can be chosen large enough so that there is no significant energy injected into the resistive output stage when there is voltage out of the rectifier. The values of R3 and R1 can be chosen so that the L/R time can drain the appropriate capacitors in the load faster than the RF frequency In some embodiments, the resistive output stage 620 may be coupled with the bias compensation circuit 625. The bias compensation circuit 625 may include any bias and/or bias compensation circuit known in the art. For example, the bias compensation circuit 625 may include any bias and/or bias compensation circuit described in U.S. patent application Ser. No. 16/523,840 titled "NANOSECOND PULSER BIAS COMPENSATION," which is incorporated into this disclosure in its entirety for all purposes.

In some embodiments, the bias compensation circuit 625 may include a bias capacitor C7, blocking capacitor C12, a blocking diode D8, switch S8 (e.g., a high voltage switch), offset supply voltage V1, resistance R2, and/or resistance R4. In some embodiments, the switch S8 comprises a high voltage switch described in U.S. Patent Application No.

62/717,637, titled "HIGH VOLTAGE SWITCH FOR NANOSECOND PULSING," and/or in U.S. patent application Ser. No. 16/178,565, titled "HIGH VOLTAGE SWITCH FOR NANOSECOND PULSING," which is incorporated into this disclosure in its entirety for all purposes.

In some embodiments, the offset supply voltage V5 may include a DC voltage source that can bias the output voltage either positively or negatively. In some embodiments, the capacitor C12 may isolate/separate the offset supply voltage V5 from the resistive output stage 620 and/or other circuit elements. In some embodiments, the bias compensation circuit 625 may allow for a potential shift of power from one portion of the circuit to another. In some embodiments, the bias compensation circuit 625 may be used to hold a wafer in place as high voltage pulses are active within the chamber. Resistance R2 may protect/isolate the DC bias supply from the driver.

In some embodiments, the switch S8 may be open while the RF driver 605 is pulsing and closed when the RF driver 605 is not pulsing. While closed, the switch S8 may, for example, short current across the blocking diode D8. Shorting this current may allow the bias between the wafer and the chuck to be less than 2 kV, which may be within acceptable tolerances.

In some embodiments, the plasma and chamber 630 may be coupled with the bias compensation circuit 625. The plasma and chamber 630, for example, may be represented by the various circuit elements shown in FIG. 6.

FIG. 6 does not include a traditional matching network such as, for example, a 50 ohm matching network or an external matching network or standalone matching network. Indeed, the embodiments described within this document do not require a 50 ohm matching network to tune the switching power applied to the wafer chamber. In addition, embodiments described within this document provide a variable output impedance RF generator without a traditional matching network. This can allow for rapid changes to the power drawn by the plasma chamber. Typically, this tuning of the matching network can take at least 100 µs-200 µs. In some embodiments, power changes can occur within one or two RF cycles, for example, 2.5 µs-5.0 µs at 400 kHz.

Figure 7:
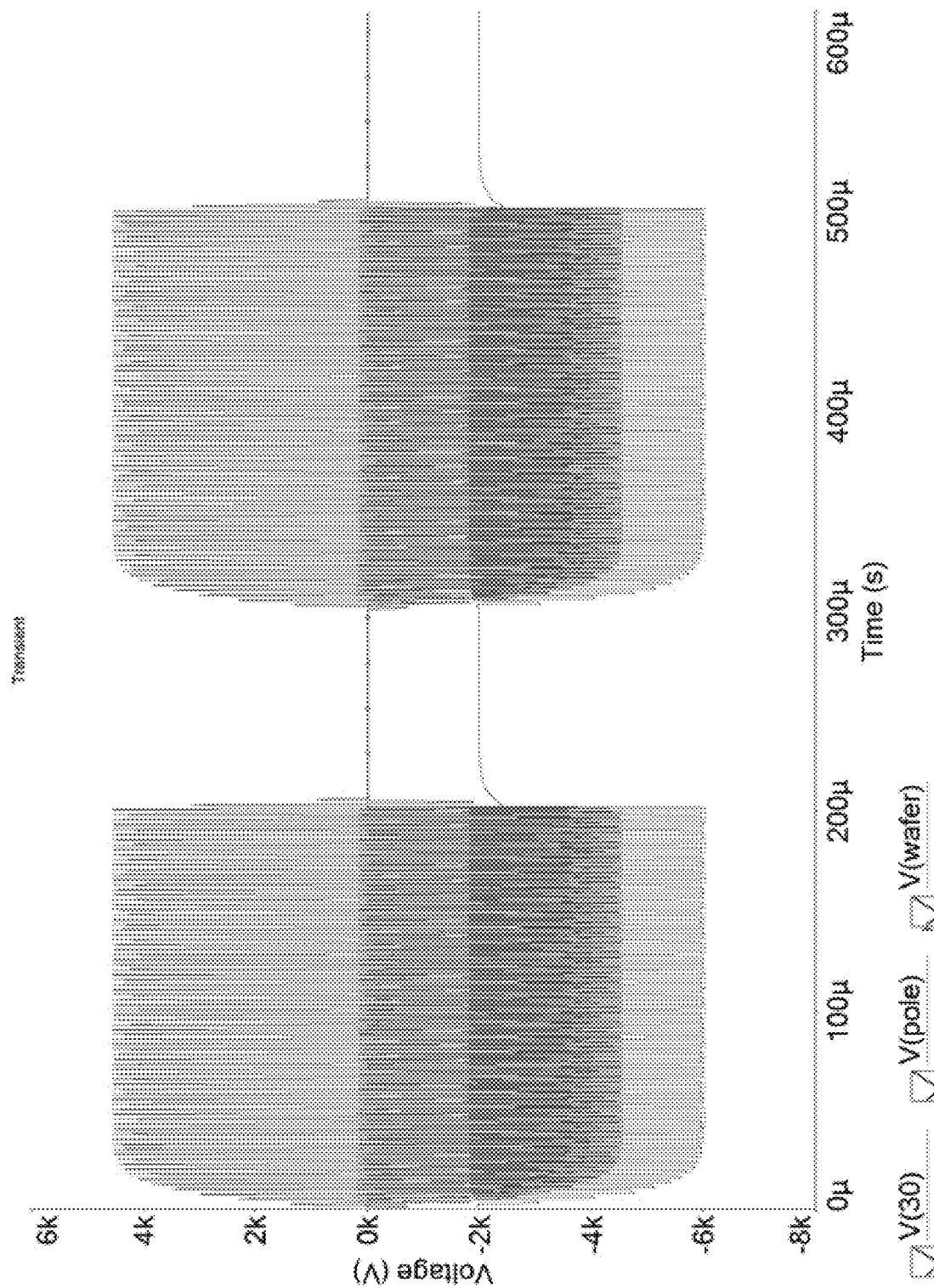
FIG. 7 is a waveform of the voltage across the transformer T1 (red), at the Pole (green), and at the wafer (blue) for a time frame of 600 µs.
Figure 8:
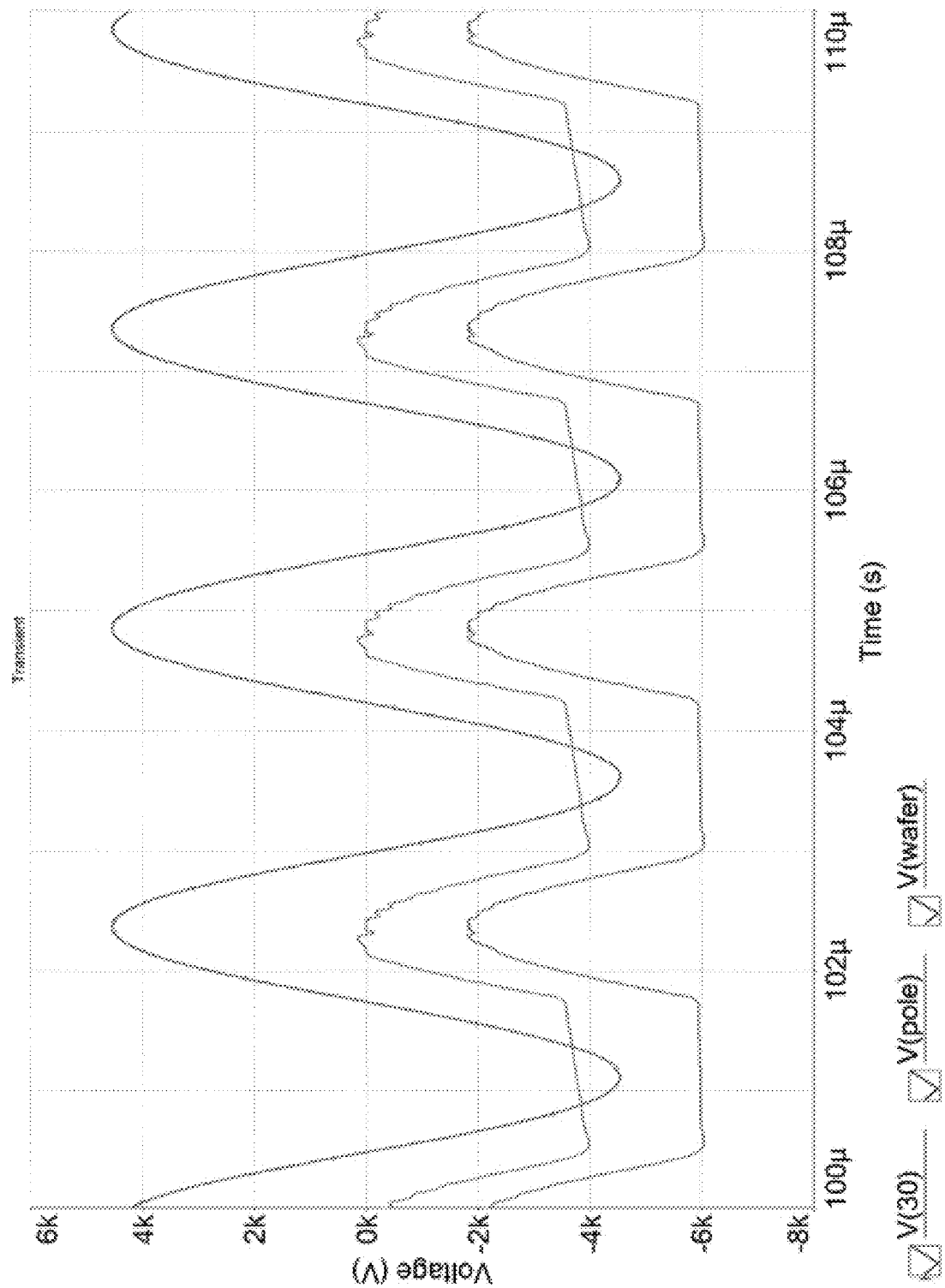
FIG. 8 is a zoomed view of the waveform over a time frame of 10 µs.

FIG. 7 is a waveform of the voltage across the transformer T1 (red), at the Pole (green), and at the wafer (blue) for a time frame of 600 µs. FIG. 8 is a zoomed view of the waveform over a time frame of 10 µs.

Figure 9:
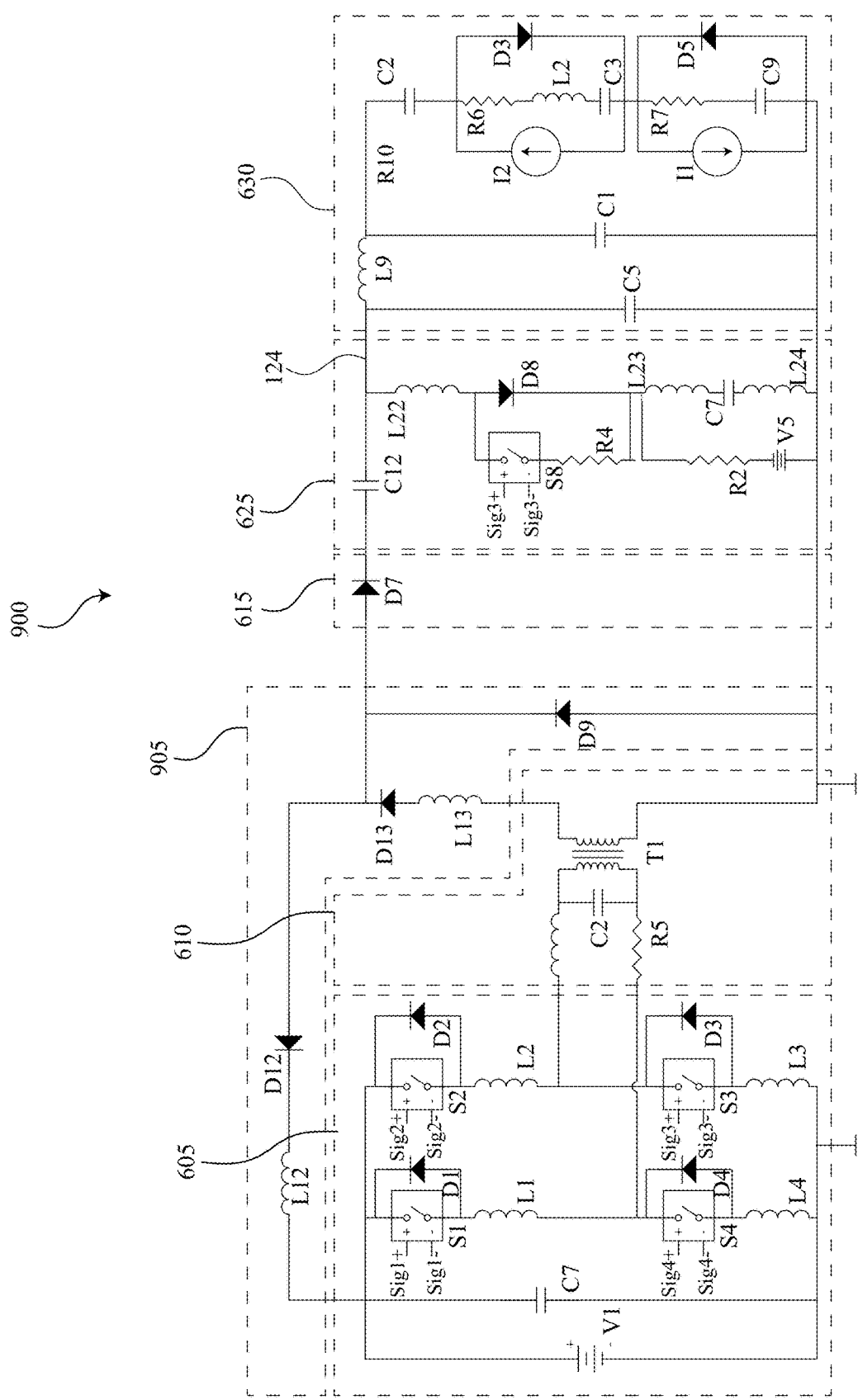
FIG. 9 is a circuit diagram of an RF Driver according to some embodiments.

FIG. 9 is a circuit diagram of an RF Driver 900 according to some embodiments. The RF Driver 900, for example, may include the RF driver 605, the resonant circuit 610, the bias compensation circuit 625, and the plasma and chamber 630. The RF Driver 900 is similar to the driver and chamber circuit 600 but without the resistive output stage 620 and includes an energy recovery circuit 905.

In this example, the energy recovery circuit 905 may be positioned on or electrically coupled with the secondary side of the transformer T1. The energy recovery circuit 905, for example, may include a diode D9 (e.g., a crowbar diode) across the secondary side of the transformer T1. The energy recovery circuit 905, for example, may include diode D10 and inductor L12 (arranged in series), which can allow current to flow from the secondary side of the transformer T1 to charge the power supply C15 and current to flow to the plasma and chamber 630. The diode D12 and the inductor L12 may be electrically connected with the secondary side of the transformer T1 and coupled with the power supply C15. In some embodiments, the energy recovery circuit 905 may include diode D13 and/or inductor L13 electrically coupled with the secondary of the transformer T1. The inductor L12 may represent the stray inductance and/or may include the stray inductance of the transformer T1.

When the nanosecond pulser is turned on, current may charge the plasma and chamber 630 (e.g., charge the capacitor C3, capacitor C2, or capacitor C9). Some current, for example, may flow through inductor L12 when the voltage on the secondary side of the transformer T1 rises above the charge voltage on the power supply C15. When the nanosecond pulser is turned off, current may flow from the capacitors within the plasma and chamber 630 through the inductor L12 to charge the power supply C15 until the voltage across the inductor L12 is zero. The diode D9 may prevent the capacitors within the plasma and chamber 630 from ringing with the inductance in the plasma and chamber 630 or the bias compensation circuit 625.

The diode D12 may, for example, prevent charge from flowing from the power supply C15 to the capacitors within the plasma and chamber 630.

The value of inductor L12 can be selected to control the current fall time. In some embodiments, the inductor L12 can have an inductance value between 1 µH-500 µH.

In some embodiments, the energy recovery circuit 905 may include a switch that can be used to control the flow of current through the inductor L12. The switch, for example, may be placed in series with the inductor L12. In some embodiments, the switch may be closed when the switch S1 is open and/or no longer pulsing to allow current to flow from the plasma and chamber 630 back to the power supply C15.

A switch in the energy recovery circuit 905, for example, may include a high voltage switch such as, for example, the high voltage switch disclosed in U.S. patent application Ser. No. 16/178,565 filed Nov. 1, 2018, titled "HIGH VOLTAGE SWITCH WITH ISOLATED POWER," which claims priority to U.S. Provisional Patent Application No. 62/717,637 filed Aug. 10, 2018, both of which are incorporated by reference in the entirety. In some embodiments, the RF driver 605 may include a high voltage switch in place of or in addition to the various components shown in RF driver 605. In some embodiments, using a high voltage switch may allow for removal of at least the transformer T1 and the switch S1.

Figure 10:
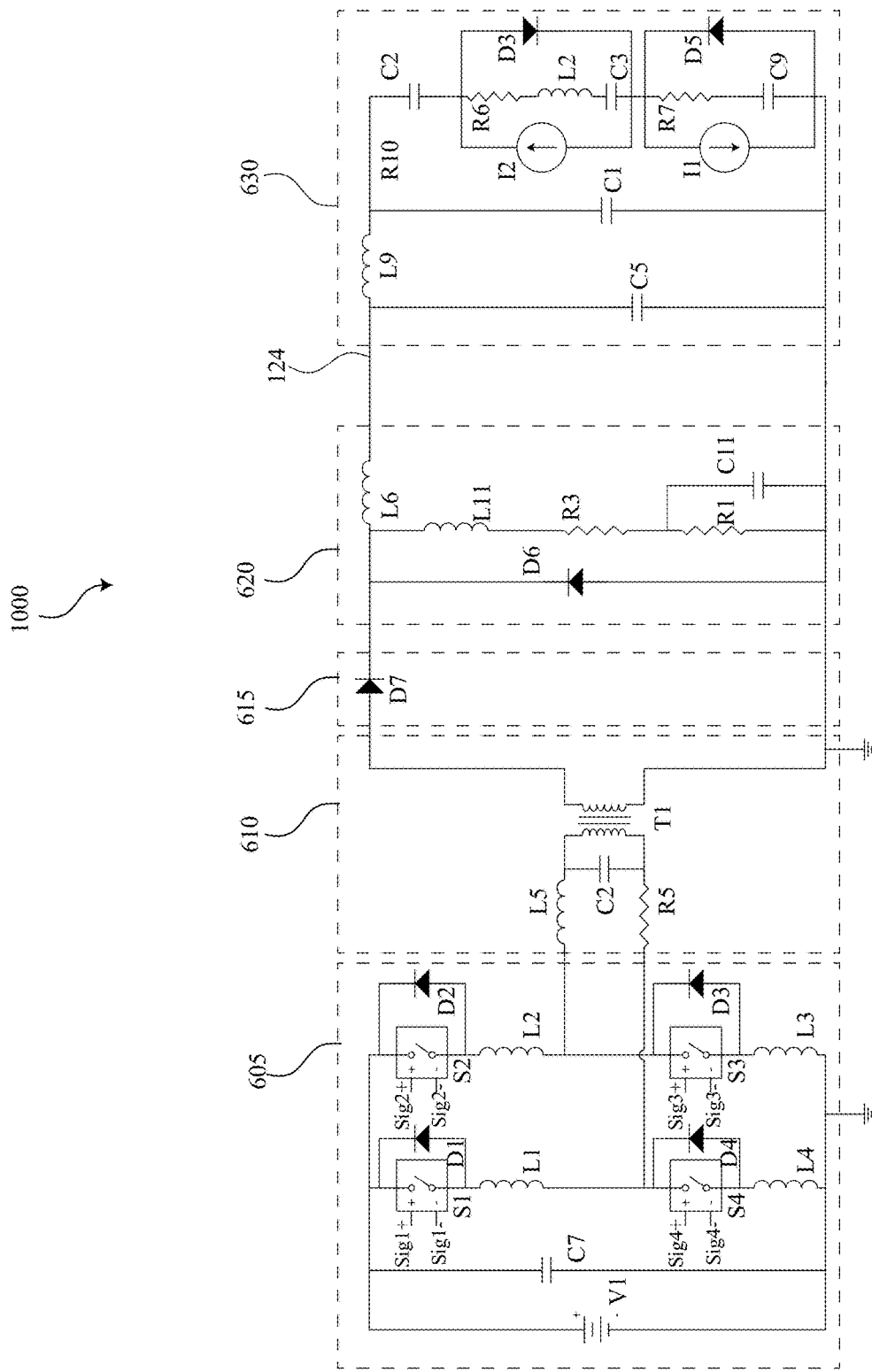
FIG. 10 is a circuit diagram of an RF Driver according to some embodiments.

FIG. 10 is a circuit diagram of a driver and chamber circuit 1000 according to some embodiments. The driver and chamber circuit 1000, for example, may include the RF driver 605, the resonant circuit 610, the resistive output stage 620, and the plasma and chamber 630. Thus, driver and chamber circuit 1000 is similar to the driver and chamber circuit 600 without the bias compensation circuit 625.

Figure 11:
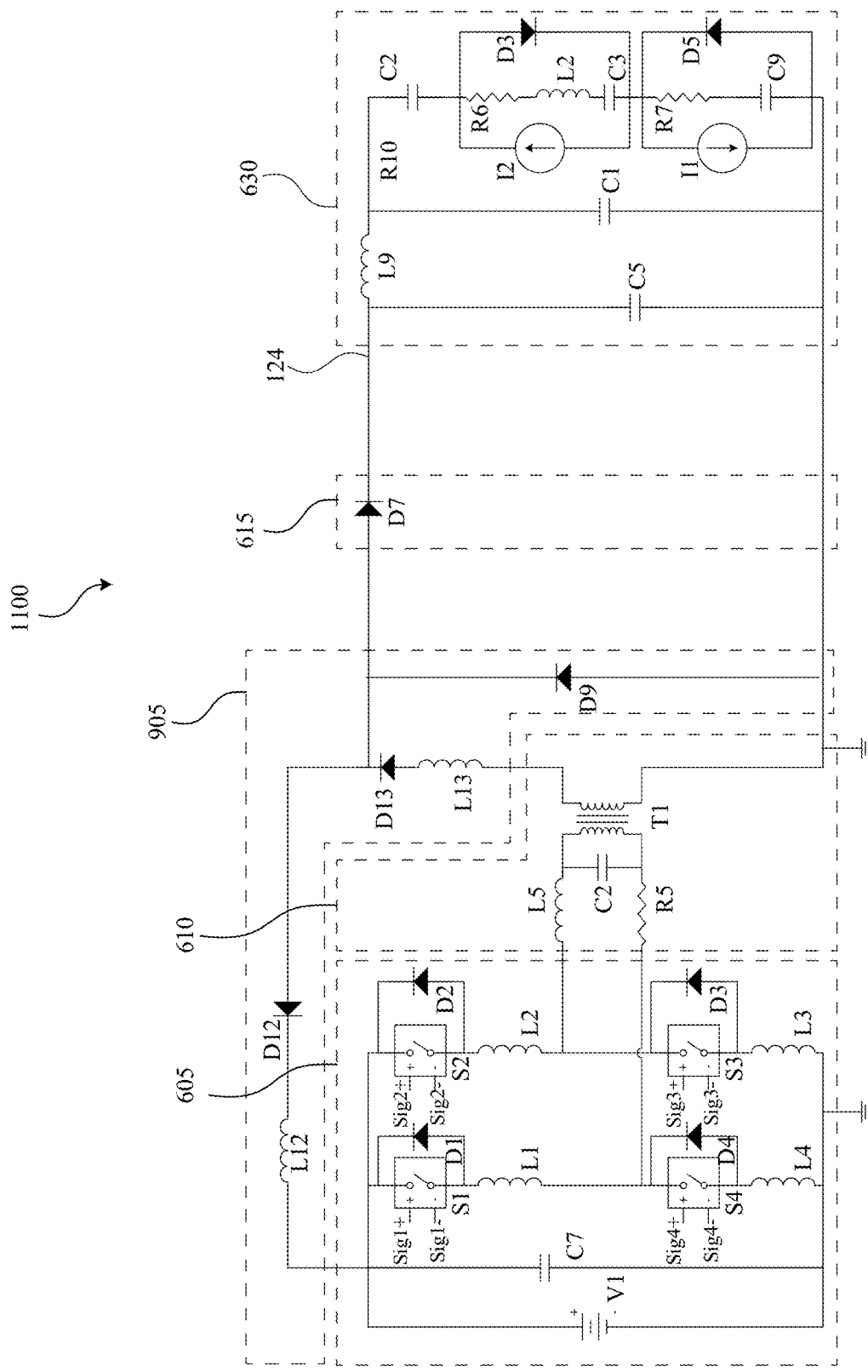
FIG. 11 is a circuit diagram of an RF Driver according to some embodiments.

FIG. 11 is a circuit diagram of a driver and chamber circuit 1100 according to some embodiments. The driver and chamber circuit 1100, for example, may include the RF driver 605, the resonant circuit 610, the energy recovery circuit 905, and the plasma and chamber 630. Thus, driver and chamber circuit 1100 is similar to the driver and chamber circuit 900 without the bias compensation circuit 625.

Figure 12:
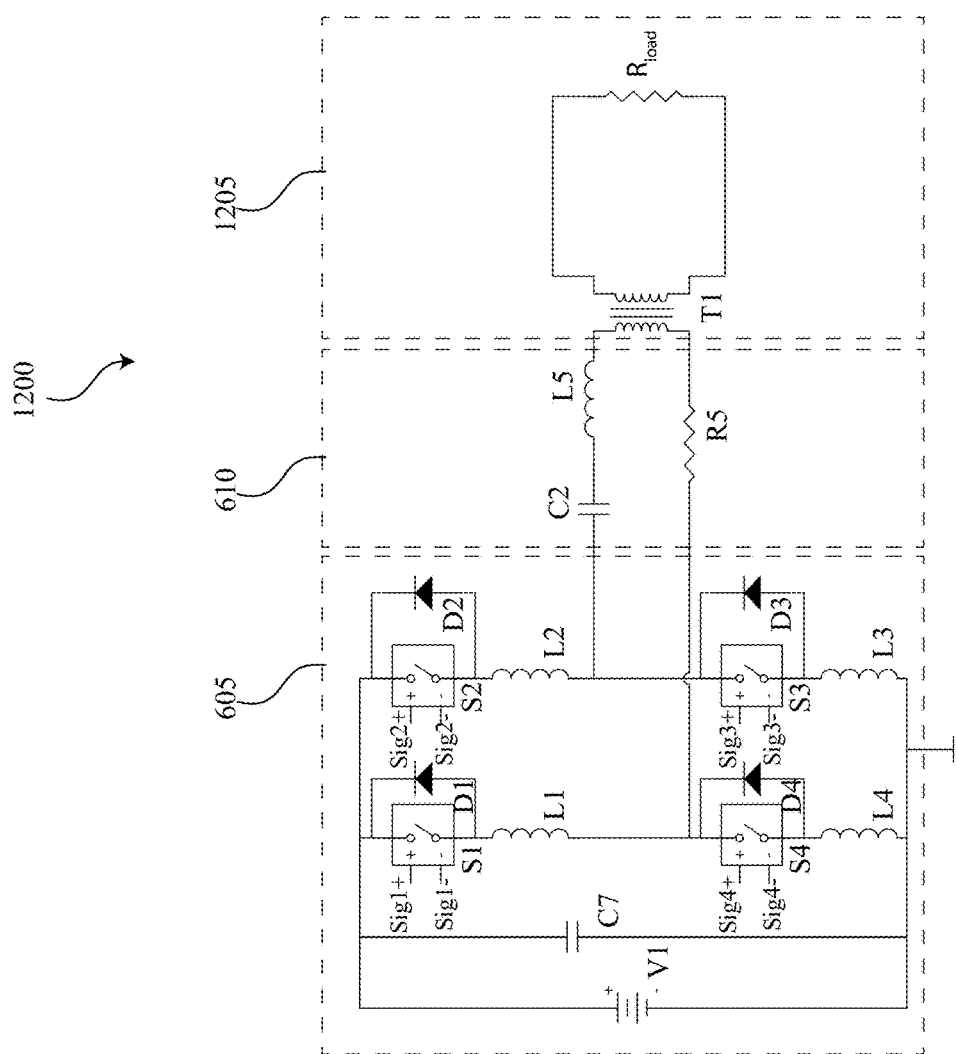
FIG. 12 is a circuit diagram of an RF Driver according to some embodiments.

FIG. 12 is a circuit diagram of a driver and a inductive discharge plasma 1200 according to some embodiments. The driver and a inductive discharge plasma 1200, for example, may include the RF driver 605, the resonant circuit 610, and an inductively discharged plasma 1205. In this example, the inductor L5 may include the antenna that is coupled with the inductively discharged plasma 1205. The transformer T1 may represent how the inductively discharged plasma 1205 couples with the antenna, which is represented at least in part by the inductor L5. The capacitor C2 may resonate with the inductor L5 to determine the resonate frequency. The RF driver 605 may produce pulses that are driven with this resonant frequency.

Figure 13:
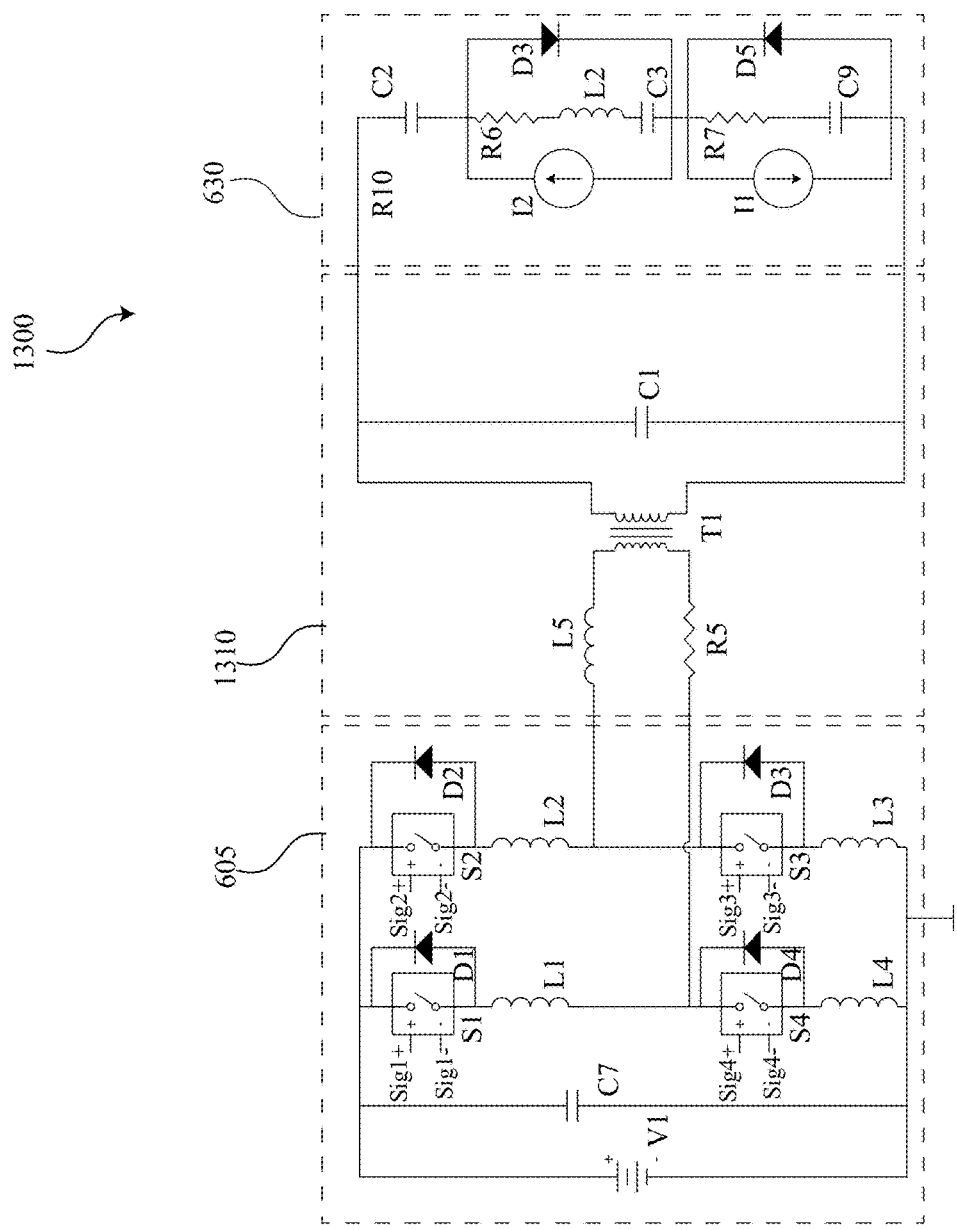
FIG. 13 is a circuit diagram of an RF Driver according to some embodiments.
Figure 14A:
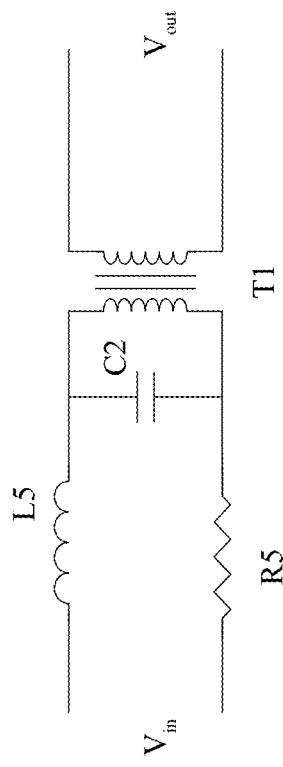
FIGS. 14A, 14B, 15A, and 15B are circuit diagrams of example resonant circuits.
Figure 14B:
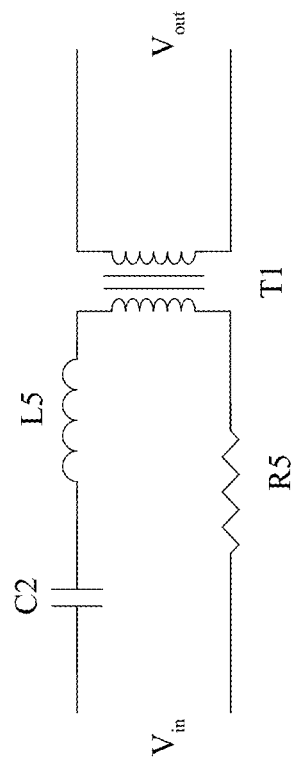
Figure 15A:
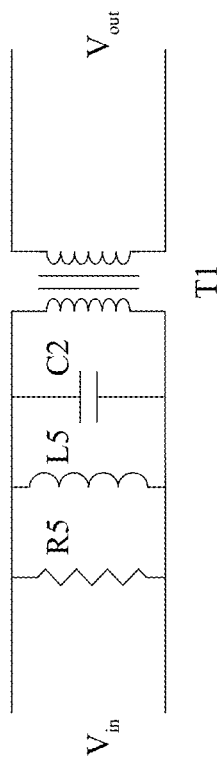
Figure 15B:
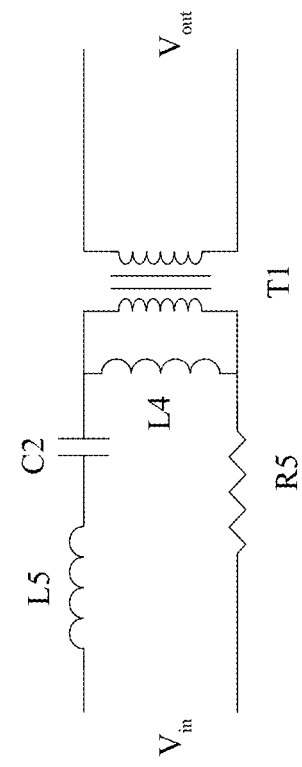

FIG. 13 is a circuit diagram of a driver and a capacitive discharge plasma 1300 according to some embodiments. The driver and a capacitive discharge plasma 1300, for example, may include the RF driver 605, the resonant circuit 1310, which may include the transformer, and the chamber 630. The capacitor C1 may represent the capacitance of the discharge geometry, any stray capacitance in the circuit, or the capacitance of any capacitors in the circuit. L5 may represent the inductance of any stray inductance in the circuit or the inductance of any inductance in the circuit. The RF driver 605 may drive the resonant circuit 1310 with a pulse frequency that is substantially equal to the resonate frequency of the resonant circuit.

In some embodiments, each switch S1, S2, S3, or S4 in the resonant circuit 605 can be switched independently or in conjunction with one or more of the other switches. For example, the signal Sig1 may be the same signal as signal Sig3. As another example, the signal Sig2 may be the same signal as signal Sig4. As another example, each signal may be independent and may control each switch S1, S2, S3, or S4 independently or separately.

In some embodiments, the transformer T1 may or may not be included in the driver and a capacitive discharge plasma 1300.

FIGS. 14A, 14B, 15A, and 15B are circuit diagrams of example resonant circuits that may be used in place of resonant circuit 610 in FIG. 6. These circuits may or may not include the transformer shown in each figure.

Figure 16:
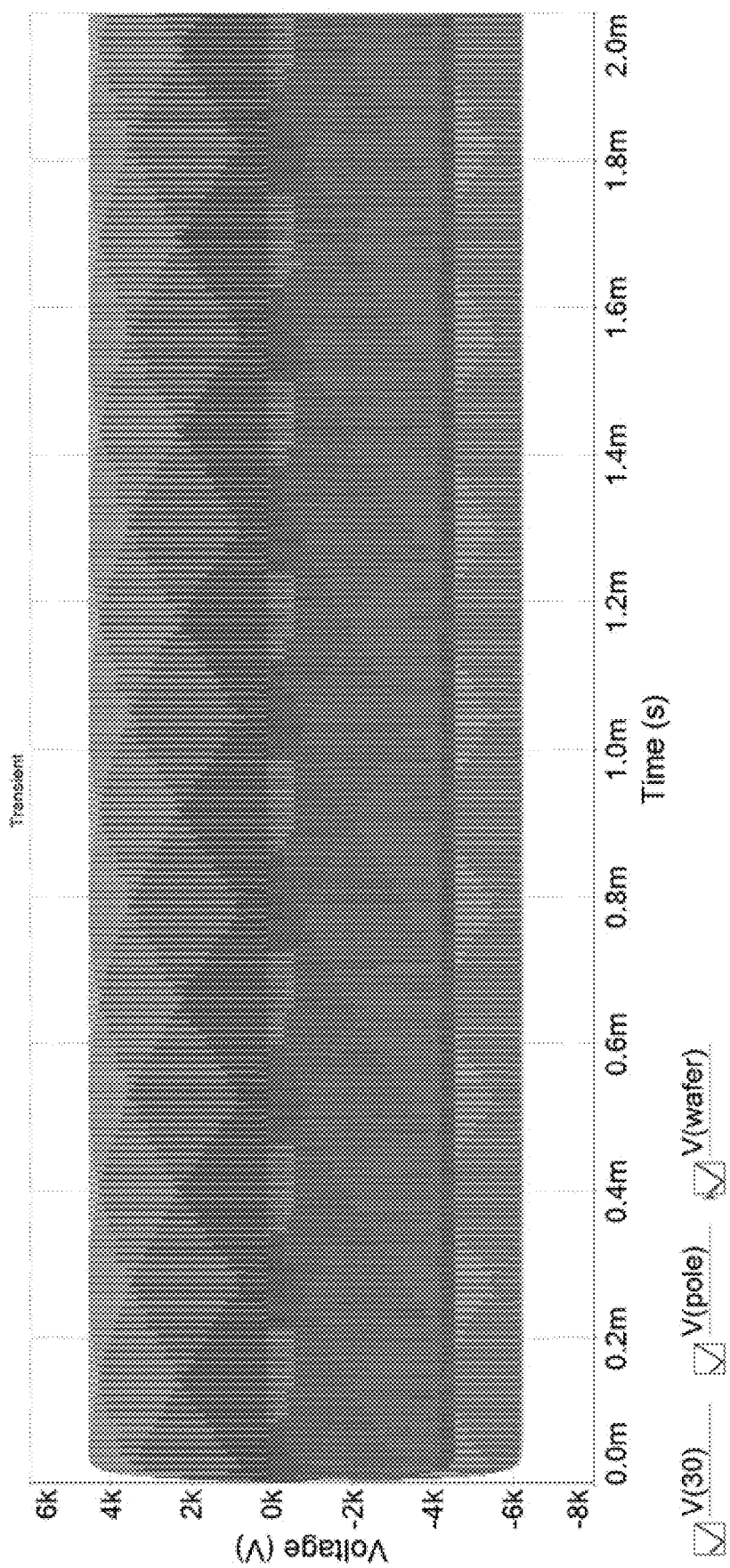
FIG. 16 is a continuous waveform of the voltage across the transformer T1 (red), at the Pole (green), and at the wafer (blue).

FIG. 16 is a continuous waveform of the voltage across the transformer T1 (red), at the Pole (green), and at the wafer (blue).

FIG. 17 is a short burst waveform of the voltage across the transformer T1 (red), at the Pole (green), and at the wafer (blue). This waveform shows a 22.5 µs long burst.

Figure 18:
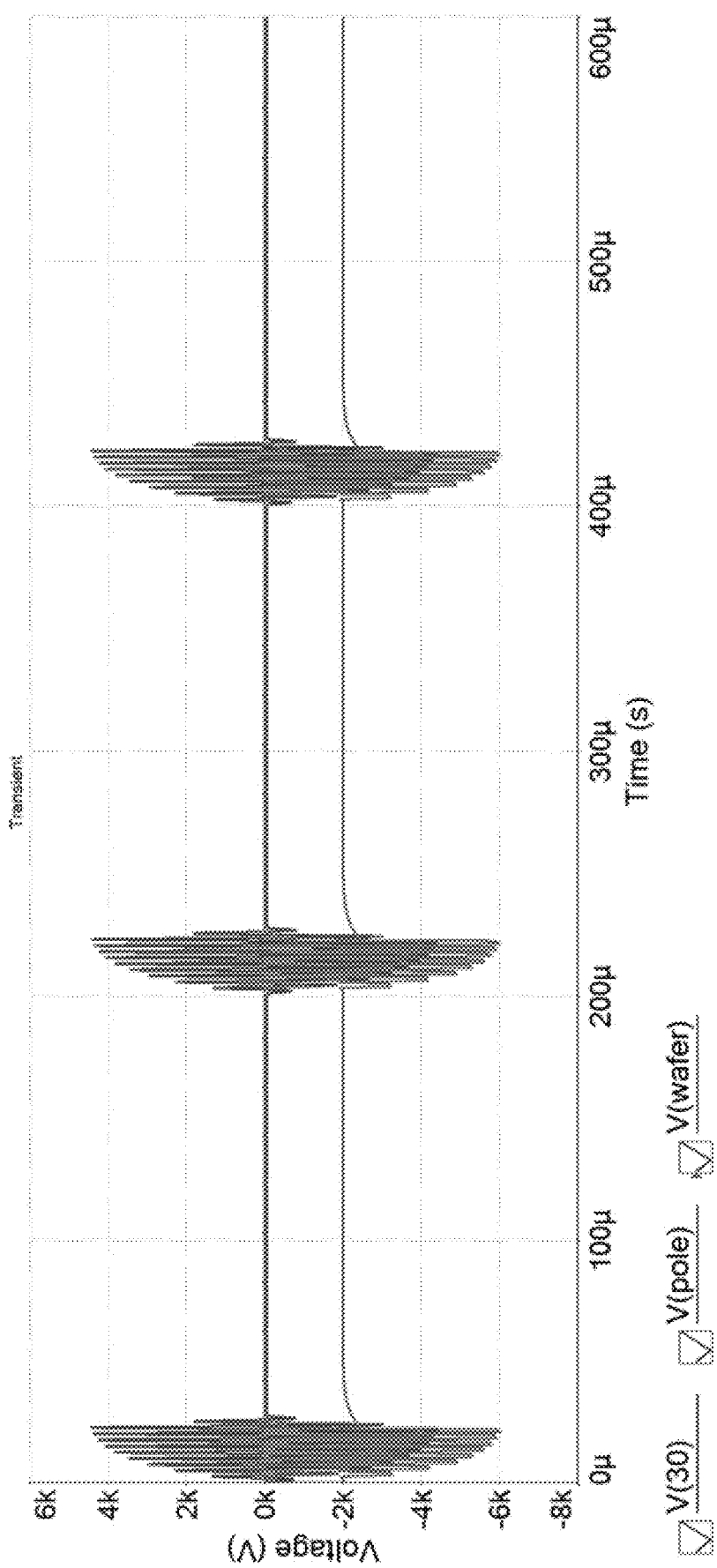
FIG. 18 is a waveform showing a series of short bursts across the transformer T1 (red), at the Pole (green), and at the wafer (blue).

FIG. 18 is a waveform showing a series of short bursts across the transformer T1 (red), at the Pole (green), and at the wafer (blue). This waveform shows repeated 22.5 µs long bursts. Embodiments described within this document provide a system whose timing can be adjusted. For example, the number of pulses in a burst, the frequency, the number of bursts, and/or the duty cycle of bursts can all be adjusted by changing the drive signal(s) (Sig1, Sig2, Sig3, or Sig4) to the switches S1, S2, S3, or S4.

In some embodiments, the diode D8 and the capacitor C7 in the bias compensation circuit 625 shown in any circuit can be arranged in a stripline such that the current flows in a U-shaped path. A stripline, for example, may be a transmission line trace surrounded by dielectric material suspended between two ground planes on internal layers of a PCB. In some embodiments, the separation between the diode D8 and the capacitor C7 can be maximized. In some embodiments, the diode D8 and the capacitor C7 stripline as wide as possible such as, for example, 10, 8, 6, 4, 3, 2, 1, ½ inches.

In some embodiments, the lead inductance L22 can be minimized or eliminated by connecting the point 124 to the input of the diode D8 (e.g., at the stray inductance L22). In some embodiments, the lead inductance L24 can be minimized or eliminated by connecting the low side of the capacitor C7 (e.g., at the stray inductance L24) directly to ground.

In this example, the bias compensation circuit 625 includes stray inductance L22 between diode D8 and the position labeled 124, stray inductance L23 between diode D8 and capacitor C7, or stray inductance L24 between capacitor C7 and ground. The circuit 500 includes plasma side inductance $L_p$ and switch side inductance $L_s$. The plasma side stray inductance $L_p$, for example, may include all the inductance whether stray, parasitic, or from any element between the bias compensation circuit 625 and the chamber 630 such as, for example, L9 and any other stray inductance on this side of the circuit. The switch side inductance $L_s$, for example, may include all the inductance whether stray, parasitic, or from any element between the bias compensation circuit 625 and the switch S1 such as, for example, L11, L5, L1, L2, L3, and/or L4, and any other stray inductance on this side of the circuit.

In some embodiments, the switch side inductance $L_s$ should be greater than the plasma side stray inductance $L_p$. In some embodiments, the plasma side stray inductance $L_p$ is 20% of the switch side inductance $L_s$. In some embodiments, the plasma side stray inductance $L_p$ is less than about 1 nH, 10 nH, 100 nH, 1 uH, etc.

In some embodiments, the stray inductance L22 has an inductance less than about 1 nH, 10 nH, 100 nH, 1 uH, etc. In some embodiments, the stray inductance L23 has an inductance less than about 1 nH, 10 nH, 100 nH, 1 uH, etc. In some embodiments, the stray inductance L24 has an inductance less than about 1 nH, 10 nH, 100 nH, 1 uH, etc. In some embodiments the sum of the stray inductance of L22, L23, and L24 is less than about 1 nH, 10 nH, 100 nH, 1 uH, etc.

In some embodiments, the stray inductance L22, L23, or L24 can be minimized In a variety of ways. For example, the conductor along stray inductance L22, L23, or L24 can be broader than industry standard such as, for example, greater than ⅛, ¼, ⅜, ½, 1, 2.5, 5 inches etc. As another example, various circuit elements, such as, for example, diode D8 or capacitor C7 may include a plurality of diodes or capacitors in parallel or series.

In some embodiments, the distance between elements may be minimized to reduce stray inductance. For example, the top conductor and the bottom conductor between which the various bias compensation circuit elements may be separated by less than about 1, 2, 5, 15, 20, 25, 30, 35, 40 cm. As another example, the discrete elements comprising diode D8 may be disposed within less than 10, 8, 6, 4, 3, 2, 1, ½ inches from the position labeled 124 or ground. As another example, the discrete elements comprising capacitor C7 may be disposed within less than 10, 8, 6, 4, 3, 2, 1, ½ inches from the position labeled 124 or ground.

In some embodiments, the volume of the discrete elements comprising either or both the diode D8 and/or capacitor C7 may be less than 1200, 1000, 750, 500 cubic centimeters.

In some embodiments, a resistor R4 may be included across diode D8. In some embodiments, the resistor R4 may have resistance values of less than about 1 kΩ to 1 MΩ such as, for example, less than about 100 kΩ.

In some embodiments, the capacitor C7 may have a capacitance less than about 1 µF or less than about 1 mF. The capacitor C7 may have a stray inductance less than about 1 nH, 10 nH, 100 nH, 1 uH, etc.

The term "or" is inclusive.

Unless otherwise specified, the term "substantially" means within 5% or 10% of the value referred to or within manufacturing tolerances. Unless otherwise specified, the term "about" means within 5% or 10% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. An RF system comprising:
   an energy storage capacitor;
   a switching circuit coupled with the energy storage capacitor, the switching circuit producing a plurality of pulses with a pulse amplitude and a pulse frequency, the pulse amplitude being greater than 100 volts;
   a transformer having a primary side and a secondary side, the transformer coupled with the switching circuit; and
   an energy recovery circuit coupled with the energy storage capacitor and the secondary side of the transformer.

2. The RF system according to claim 1, further comprising:
   a resonant circuit, wherein the resonant circuit comprises a circuit element selected from the group consisting of a capacitor, an inductor, and a resistor;
   wherein the resonant circuit has a resonant frequency substantially equal to the pulse frequency, and the resonant circuit increases the pulse amplitude to a voltage greater than 1 kV; and
   a plasma chamber coupled with the resonant circuit.

3. The RF system according to claim 1, wherein the switching circuit comprises either a full-bridge driver or a half-bridge driver, and wherein the energy recovery circuit comprises a diode and an inductor.

4. The RF system according to claim 1, wherein the resonant circuit comprises an inductor, and the resonant frequency comprises $$f_{resonant} \approx \frac{1}{2\pi\sqrt{(L)(C)}},$$

where the inductance L includes any stray inductance of the transformer and the inductance of the inductor, and the capacitance C includes any stray capacitance of the transformer.

5. The RF system according to claim 1, wherein the resonant circuit comprises a capacitor, and the resonant frequency comprises $$f_{resonant} \approx \frac{1}{2\pi\sqrt{(L)(C)}},$$

where the inductance L includes any stray inductance of the transformer, and the capacitance C includes any stray capacitance of the transformer and the capacitance of the capacitor.

6. An RF plasma system comprising:
   an RF driver in a half-bridge or full-bridge configuration, the RF driver comprising a plurality of switches producing a plurality of pulses with a pulse amplitude and a pulse frequency, the pulse amplitude being greater than 100 volts;
a transformer coupled with the RF driver;
an energy recovery circuit coupled with the transformer;
a bias compensation circuit coupled with the energy recovery circuit; and
a plasma chamber coupled with the bias-compensation circuit.

7. The RF plasma system according to claim 6, further comprising a resonant circuit coupled with the RF driver, the resonant circuit having a resonant frequency substantially equal to the pulse frequency and the resonant circuit increases the amplitude of the plurality of pulses to a voltage greater than 1 kV.

8. The RF plasma system according to claim 6, wherein each of the plurality of switches is coupled in parallel with a respective diode.

9. The RF plasma system according to claim 6, further comprising a half-wave rectifier coupled with the energy recovery circuit.

10. The RF plasma system according to claim 9, wherein the half-wave rectifier comprises a blocking diode.

11. The RF plasma system according to claim 6, wherein either or both the inductance (L) and/or the capacitance (C) of the transformer determine the resonant frequency according to:

$$f_{resonant} \approx \frac{1}{2\pi\sqrt{(L)(C)}}.$$

12. The RF plasma system according to claim 6, wherein the resonant frequency comprises $$f_{resonant} \approx \frac{1}{2\pi\sqrt{(L)(C)}},$$

where the inductance L includes any stray inductance of the transformer and the capacitance C includes any stray capacitance of the transformer.

13. The RF plasma system according to claim 6, wherein the bias compensation circuit comprises a high voltage switch.

14. The RF plasma system according to claim 6, wherein the plurality of switches is driven with a frequency selected from the group consisting of 400 kHz, 0.5 MHz, 2.0 MHz, 4.0 MHz, 13.56 MHz, 27.12 MHz, 40.68 MHz, and 50 MHz.

15. An RF plasma system comprising:
an RF driver in a half-bridge or full-bridge configuration, the RF driver comprising a plurality of switches producing high voltage pulses with a pulse amplitude and a pulse frequency, the pulse amplitude being greater than 100 volts and the pulse frequency being greater than 100 kHz;
an inductively coupled plasma source that is electrically coupled with the high voltage switching power supply; and
a capacitor, wherein the capacitor and the inductance of the inductively coupled plasma source resonate with a resonant frequency substantially equal to the pulse frequency.

16. The RF plasma according to claim 15, wherein the resonant frequency comprises $$f_{resonant} \approx \frac{1}{2\pi\sqrt{(L)(C)}},$$

where the inductance L includes the inductance of the inductively coupled plasma source and the capacitance C includes the capacitance of the capacitor.

17. The RF plasma according to claim 15, wherein the wherein each of the plurality of switches is coupled in parallel with a respective diode.

18. An RF plasma system comprising:
an RF driver in a half-bridge or full-bridge configuration, the RF driver comprising a plurality of switches producing high voltage pulses with a pulse amplitude and a pulse frequency, the pulse amplitude being greater than 100 volts and the pulse frequency being greater than 100 kHz;
a capacitively coupled plasma; and
an inductor, wherein the inductor and the capacitance of the capacitively coupled plasma form a resonant circuit with a resonant frequency substantially equal to the pulse frequency.

19. The RF plasma according to claim 18, wherein the resonant frequency comprises $$f_{resonant} \approx \frac{1}{2\pi\sqrt{(L)(C)}},$$

where the inductance L includes the inductance of the inductor and the capacitance C includes the capacitance of the capacitively coupled plasma.

20. The RF plasma according to claim 18, wherein the wherein each of the plurality of switches is coupled in parallel with a respective diode.

* * * * *